(12) United States Patent
Oh et al.

(10) Patent No.: US 10,777,282 B2
(45) Date of Patent: Sep. 15, 2020

(54) METHOD OF REWRITING DATA OF MEMORY DEVICE, MEMORY CONTROLLER CONTROLLING THE MEMORY DEVICE, AND CONTROLLING METHOD OF THE MEMORY CONTROLLER

(71) Applicant: SAMSUNG ELECTRONICS CO., LTD., Suwon-si, Gyeonggi-do (KR)

(72) Inventors: Eun Chu Oh, Hwaseong-si (KR); Young-geun Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/531,787

(22) Filed: Aug. 5, 2019

(65) Prior Publication Data
US 2020/0202953 A1    Jun. 25, 2020

(30) Foreign Application Priority Data
Dec. 21, 2018   (KR) .................... 10-2018-0167887

(51) Int. Cl.
*G11C 16/34* (2006.01)
*G11C 16/26* (2006.01)
*G11C 29/42* (2006.01)
*G06F 11/22* (2006.01)
(Continued)

(52) U.S. Cl.
CPC .......... *G11C 16/26* (2013.01); *G06F 11/2205* (2013.01); *G06F 13/1668* (2013.01); *G11C 16/3418* (2013.01); *G11C 29/42* (2013.01); *G11C 2029/0407* (2013.01)

(58) Field of Classification Search
CPC ..... G11C 16/0483; G11C 16/26; G11C 16/08; G11C 16/10; G11C 11/5642; G11C 11/5628; G11C 29/52; G11C 16/32; G11C 16/14; G11C 29/028; G11C 29/42; G11C 16/16; G11C 29/04; G11C 29/08; G11C 29/4401
See application file for complete search history.

(56) References Cited

U.S. PATENT DOCUMENTS

| | | |
|---|---|---|
| 7,778,066 B2 | 8/2010 | Horii et al. |
| 7,796,424 B2 | 9/2010 | Happ et al. |
| 7,986,549 B1 | 7/2011 | Tang et al. |

(Continued)

FOREIGN PATENT DOCUMENTS

KR    10-2017-0022423 A    3/2017

*Primary Examiner* — Hien N Nguyen
(74) *Attorney, Agent, or Firm* — Lee IP Law, P.C.

(57) ABSTRACT

A memory controller to control a memory device includes an Error Checking and Correcting (ECC) engine to perform error detection on data read from the memory device and a data operation manager. The data operation manager is to control a first rewrite operation of the memory device on selected memory cells to compensate for a drift in a distribution of the selected memory cells, based on a result of a test read operation of the memory device on test cells, determine a distribution adjustment degree based on a result of a normal read operation, as an ECC decoding operation corresponding to the normal read operation of the memory device is successfully performed by using the ECC engine, and control a second rewrite operation of the memory device based on the determined distribution adjustment degree.

20 Claims, 25 Drawing Sheets

(51) Int. Cl.
  *G06F 13/16* (2006.01)
  *G11C 29/04* (2006.01)

(56) References Cited

U.S. PATENT DOCUMENTS

| | | |
|---|---|---|
| 8,559,226 B2 | 10/2013 | Abe et al. |
| 8,838,883 B2 | 9/2014 | D'Abreu et al. |
| 9,070,473 B2 | 6/2015 | Bedeschi et al. |
| 9,136,007 B2 * | 9/2015 | Shirakawa ............. G11C 16/26 |
| 9,378,830 B2 | 6/2016 | Khoueir et al. |
| 9,437,290 B2 | 9/2016 | Lee et al. |
| 9,646,689 B2 | 5/2017 | Bedeschi et al. |
| 9,875,804 B2 * | 1/2018 | Tokiwa .................. G11C 7/067 |
| 9,953,703 B2 | 4/2018 | Hahn et al. |
| 2004/0057316 A1 * | 3/2004 | Kozakai ................. G11C 29/76 |
| | | 365/222 |
| 2012/0113724 A1 * | 5/2012 | Sako ...................... G11C 29/82 |
| | | 365/185.22 |
| 2014/0177355 A1 | 6/2014 | Kim |

\* cited by examiner

FIG. 22A

| Distribution Adjustment Information (DAI) ||
|---|---|
| # of STR errs - # of RTS errs | Distribution Adjustment Degree |
| Nref_1k ~ | -DEG_1k |
| ... | ... |
| Nref_12 ~ Nref_13 | - DEG_12 |
| Nref_11 ~ Nref_12 | - DEG_11 |
| 0 ~ Nref_11 | 0 |
| 0 | 0 |
| - Nref_21 ~ 0 | 0 |
| - Nref_22 ~ - Nref_21 | + DEG_21 |
| - Nref_23 ~ - Nref_22 | + DEG_22 |
| ... | ... |
| ~ - Nref_2m | + DEG_2m |

FIG. 22B

| Distribution Adjustment Information (DAI) | |
|---|---|
| # of ON Cells | Distribution Adjustment Degree |
| Nref_1n ~ | −DEG_1n |
| ... | |
| Nref_32 ~ Nref_33 | − DEG_32 |
| Nref_31 ( = Nth4) ~ Nref_32 | − DEG_31 |
| Nref_41 ( = Nth5) ~Nref_31 ( = Nth4) | 0 |
| Nref_42 ~ Nref_41 | + DEG_41 |
| Nref_43 ~ Nref_42 | + DEG_42 |
| ... | ... |
| ~ Nref_4p | + DEG_4p |

METHOD OF REWRITING DATA OF MEMORY DEVICE, MEMORY CONTROLLER CONTROLLING THE MEMORY DEVICE, AND CONTROLLING METHOD OF THE MEMORY CONTROLLER

CROSS-REFERENCE TO RELATED APPLICATION

Korean Patent Application No. 10-2018-0167887, filed on Dec. 21, 2018, in the Korean Intellectual Property Office, and entitled: "Method of Rewriting Data of Memory Device, Memory Controller Controlling the Memory Device, and Controlling Method of the Memory Controller," is incorporated by reference herein in its entirety.

BACKGROUND

1. Field

Embodiments relate to a method of rewriting data of a memory device, a memory controller, and a method of controlling the memory device by using the memory controller, and more particularly, to a memory device for performing data rewrite operations, a memory controller for controlling the memory device, and a controlling method of the memory controller.

2. Description of the Related Art

As non-volatile memory devices, including flash memory, resistive memory devices such as phase-change RAM (PRAM), Nano-Floating Gate memory (NFGM), polymer RAM (PoRAM), magnetic RAM (MRAM), ferroelectric RAM (FeRAM), resistive RAM (RRAM) are well known. A resistive memory has a high speed of DRAM and a non-volatile characteristic of a flash memory.

In the resistive memory, fluctuation in a threshold voltage or fluctuation in a resistance distribution of the memory cells may be relatively great. As fluctuation in the resistance distribution of the memory cells may cause errors in data read operations, a method of compensating for fluctuation in the resistance distribution is required.

SUMMARY

According to an aspect, there is provided a memory controller configured to control a memory device, the memory controller including: an Error Checking and Correcting (ECC) engine configured to perform error detection on data read from the memory device; and a data operation manager configured to control a first rewrite operation of the memory device on selected memory cells to compensate for a drift in a distribution of selected memory cells, based on a result of a test read operation of the memory device on test cells, determine a distribution adjustment degree based on a result of a normal read operation, as an ECC decoding operation by using the engine, which corresponds to the normal read operation of the memory device, is successfully performed, and control a second rewrite operation of the memory device based on the determined distribution adjustment degree.

According to another aspect, there is provided a controlling method of a memory controller, the method including: controlling, based on a result of a test read operation on test cells stored in a memory device, a first rewrite operation of the memory device to compensate for a drift in a distribution with respect to selected memory cells; controlling a normal read operation of the memory device performed by using a normal read pulse on the selected memory cells; and controlling, based on a distribution adjustment degree determined according to a result of the normal read operation, a second rewrite operation of the memory device with respect to the selected memory cells.

According to another aspect, a method of rewriting data of a memory device may include: performing, on selected memory cells, a normal data write operation including a normal reset operation to form a reset-state normal distribution by using a normal reset pulse and a normal set operation to form a set-state normal distribution by using a normal set pulse; performing a partial rewrite operation on the selected memory cells for compensating for the drift when the drift in the distribution in the memory cells is detected according to a test read operation on test cells; performing a normal read operation on the selected memory cells by using a normal read pulse; identifying a direction of the degradation in the distribution of the memory cells, the direction identified according to the performing of the normal read operation; and performing an adaptive rewrite operation for forming distributions at a direction opposite the identified direction of the degradation, based on the normal distribution in the reset-state and the normal distribution in the set-state.

BRIEF DESCRIPTION OF THE DRAWINGS

Features will become apparent to those of skill in the art by describing in detail exemplary embodiments with reference to the attached drawings in which:

FIGS. 22A and 22B illustrate distribution adjustment information according to an example embodiment.

DETAILED DESCRIPTION

Figure 1:
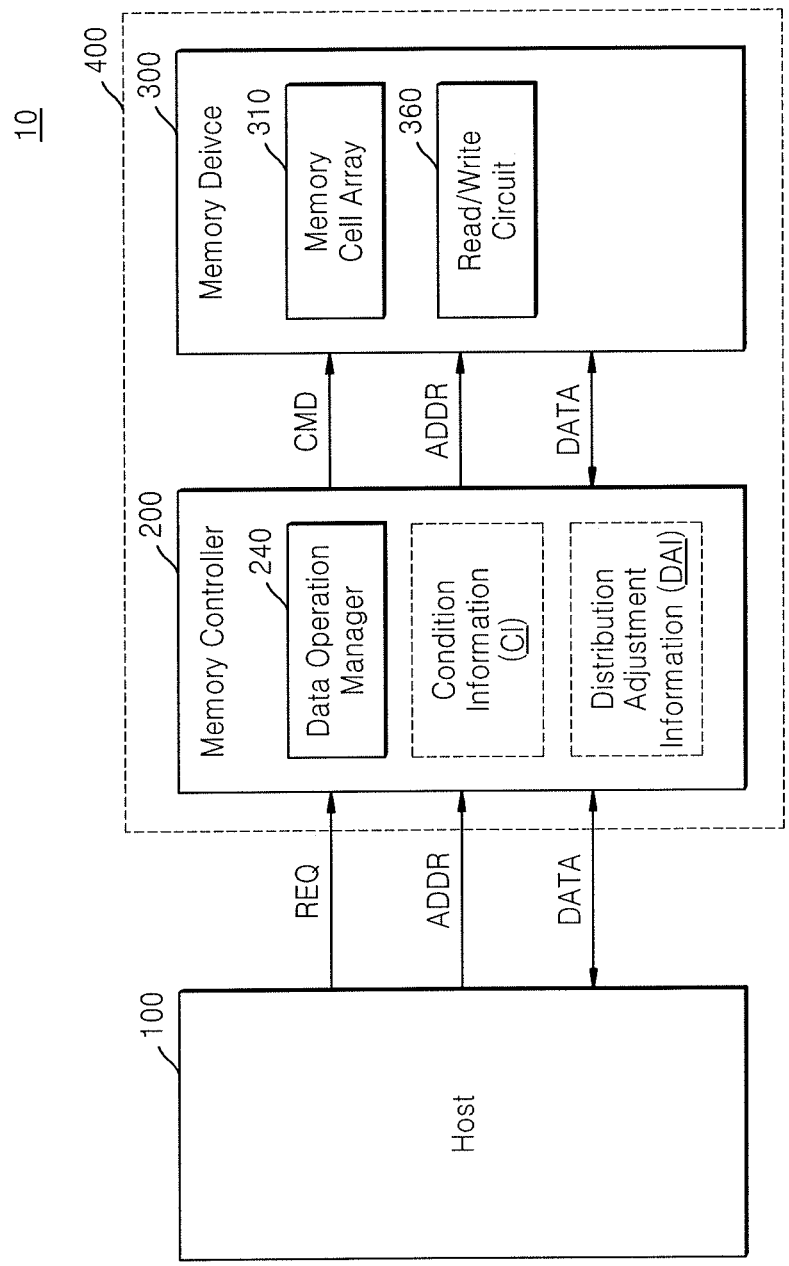
FIG. 1 illustrates a data processing system according to an example embodiment.

FIG. 1 illustrates a data processing system 10 according to an example embodiment. The data processing system 10 may include a host 100 and a memory system 400. The memory system 400 may include a memory controller 200 and a memory device 300. The data processing system 10 may be used for one of various electronic devices, e.g., an ultra mobile PC (UMPC), a workstation, a Netbook, a personal digital assistant (PDA), a portable computer, a web tablet, a wireless phone, a mobile phone, a smart phone, an e-book, a portable multimedia player (PMP), a handheld game console, a navigation system, a black box, a digital camera, and so on.

The data processing system 10 may be embodied in various forms. For example, the host 100, the memory controller 200, and the memory device 300 may each be provided as a chip, a package, or a module. However, in an implementation, the memory controller 200, together with the memory device 300, may be provided as the memory system 400 or a storage device.

In addition, the memory system 400 may be included in a PC card, a CompactFlash card, a smart media card, a memory stick, a multi-media card (MMC), an SD card, a universal flash storage (UFS), and the like. In an embodiment, the memory system 400 may be included in a solid state disk/drive (SSD). Hereinafter, for convenience of explanation, it is assumed that the memory system 400 is embodied as a storage device.

The host 100 may transmit a data operation request REQ and an address ADDR to the memory controller 200 and may also exchange data DATA with the memory controller 200. The host 100 and the memory controller 200 may communicate with each other through various protocols. For example, the host 100 and the memory controller 200 may communicate with each other through at least one of various interface protocols such as a universal storage bus (USB) protocol, a multi-media card (MMC) protocol, a peripheral component interconnect express (PCI-E) protocol, an advanced technology attachment (ATA) protocol, a serial-ATA protocol, a parallel-ATA protocol, a small computer system interface (SCSI) protocol, an enhanced small device interface (ESDI) protocol, and an integrated drive electronics (IDE) protocol.

The memory controller 200 may control the memory device 300. For example, the memory controller 200 may, in response to a data operation request REQ received from the host 100, control the memory device 300 to read data DATA stored in the memory device 300 or write data DATA to the memory device 300. The memory controller 200 may, by providing an address ADDR, a command CMD, and control signals to the memory device 300, control data operations including write operations and read operations of the memory device 300. In addition, data DATA for the above-mentioned data operations may be transmitted or received between the memory controller 200 and the memory device 300.

The memory device 300 may include a memory cell array 310 and a read/write circuit 360. In an embodiment, the memory cell array 310 may include resistive memory cells and, in this case, the memory device 300 may be referred to as "a resistive memory device". Hereinafter, an embodiment in which the memory device 300 is a resistive memory device will be mainly described. However, embodiments may also be applied to various kinds of memory devices including a non-volatile memory device, e.g., a flash memory device, or a volatile memory device.

The read/write circuit 360, which is connected to the memory cell array 310 through bit lines and/or word lines, may write data to a memory cell or read data from the memory cell. In an embodiment, the read/write circuit 360 may be connected to a plurality of word lines and/or a plurality of bit lines and write or read data. For example, in a read operation, the read/write circuit 360 may apply a voltage corresponding to a read pulse to the selected memory cell; and in a write operation, the read/write circuit 360 may apply a current corresponding to a reset pulse or a set pulse to the selected memory cell.

The memory controller 200 according to an embodiment may include a data operation manager 240 and may also store condition information CI and distribution adjustment information DAI.

The data operation manager 240 may control data operations, e.g., a read operation and a write operation, of the memory device 300. The data operation manager 240 may be referred to as a data operation management circuit. In an embodiment, the data operation manager 240 may control rewrite operations of the memory device 300. The rewrite operations may include a first rewrite operation and a second rewrite operation. The first rewrite operation, which may also be referred to as a partial rewrite operation, indicates a data operation for compensating for a drift in a resistance distribution of memory cells. The first rewrite operation will be described in more detail with reference to FIGS. 8 through 12. The second rewrite operation, which may be referred to as an adaptive rewrite operation, indicates a data operation to adaptively rewrite data according to characteristics of the memory cells. The second rewrite operation will be described in more detail with reference to FIGS. 13 through 22B hereinafter.

Throughout the specification, for distinction from the first rewrite operation and the second rewrite operation, a read operation and a write operation, which are general, may respectively be referred to as a normal read operation and a normal write operation. Throughout the specification, for convenience of explanation, a resistance distribution of the memory cells will be in short referred to as a distribution of memory cells.

In an embodiment, based on a result of a test read operation on test cells stored in the memory cell array 310, the data operation manager 240 may control the first rewrite operation of the memory device 300. For example, the data operation manager 240 may identify the distribution of the memory cells using the result of the test read operation. When the distribution of the test cells fulfills a first condition that indicates degradation of the distribution, the data operation manager 240 may control the memory device 300 to perform the first rewrite operation. The first condition, which may be included in the condition information CI, may include a case in which the number of error cells detected in the test read operation using a first read level is greater than a first threshold value and a case in which the number of on cells corresponding to the test read operation using a second read level is greater than a second threshold value. The first read level may be equal or similar to a normal read level. A value of the second read level may be greater than a value of the first read level.

In the first rewrite operation of the memory device 300, the data operation manager 240 may control the memory device 300 to apply a voltage corresponding to a partial rewrite pulse to selected memory cells. In an embodiment, compared to the normal read pulse, the partial rewrite pulse may have a higher voltage level and a shorter duration. However, in an implementation, the voltage level of the partial rewrite pulse may be similar to or lower than a voltage level of the normal read pulse. In addition, in an implementation, the duration of the partial rewrite pulse may be equal to or similar to a time period consumed for precharge during the normal read operation. In an implementation, the voltage level of the partial rewrite pulse may be lower than a voltage level of a pulse used in the write operation.

The data operation manager 240 may control the normal read operation of the memory device 300 on the selected memory cells stored in the memory cell array 310.

The data operation manager 240 may identify a distribution of the selected memory cells by using the result of the normal read operation and determine a distribution adjustment degree based on the distribution of the selected memory cells. The distribution adjustment degree may indicate a degree by which the distribution of the memory cells is adjusted in the second rewrite operation of the memory device 300. In an implementation, when set-state memory cells from among the selected memory cells have a resistance distribution higher than a set-state normal distribution, the data operation manager 240 may determine the distribution adjustment degree such that the set-state memory cells from among the selected memory cells have a resistance distribution lower than the set-state normal distribution. In an implementation, the data operation manager 240 may determine the distribution adjustment degree based on the distribution adjustment information DAI. Likewise, in an implementation, when reset-state memory cells from among the selected memory cells have a resistance distribution lower than a reset-state normal distribution, the data operation manager 240 may determine the distribution adjustment degree such that the reset-state memory cells from among the selected memory cells have a resistance distribution higher than the reset-state normal distribution.

Here, the set-state normal distribution may indicate a distribution before degradation, after a normal set operation using a normal set pulse is performed on the memory cells. Likewise, the reset-state normal distribution may indicate a distribution before degradation, after a normal reset operation by using a normal reset pulse is performed on the memory cells. In other words, the set-state normal distribution may indicate an ideal distribution of the set-state memory cells and the reset-state normal distribution may indicate an ideal distribution of the reset-state memory cells.

The data operation manager 240 may control the second rewrite operation of the memory device 300 based on the determined distribution adjustment degree. The second rewrite operation may be performed in a Data Comparison Write (DCW) off mode.

By using the data processing system 10 according to an example embodiment, the first rewrite operation of the memory device 300 may be controlled based on the result of the test operation on the test cells, fluctuation (or degradation) in the distribution of the memory cells may be compensated for by controlling the second rewrite operation based on the result of the normal read operation, and read errors due to the fluctuation in the distribution of the memory cells may be reduced.

In addition, the memory cells may respectively have different characteristics (e.g., a drift characteristic, a characteristic of being influenced by neighboring cells, etc.). By performing the second rewrite operation to adjust a position of the distribution considering fluctuation (or degradation) of a future distribution, the data processing system 10 according to an example embodiment may adaptively control the characteristics of the memory cells.

Figure 2:
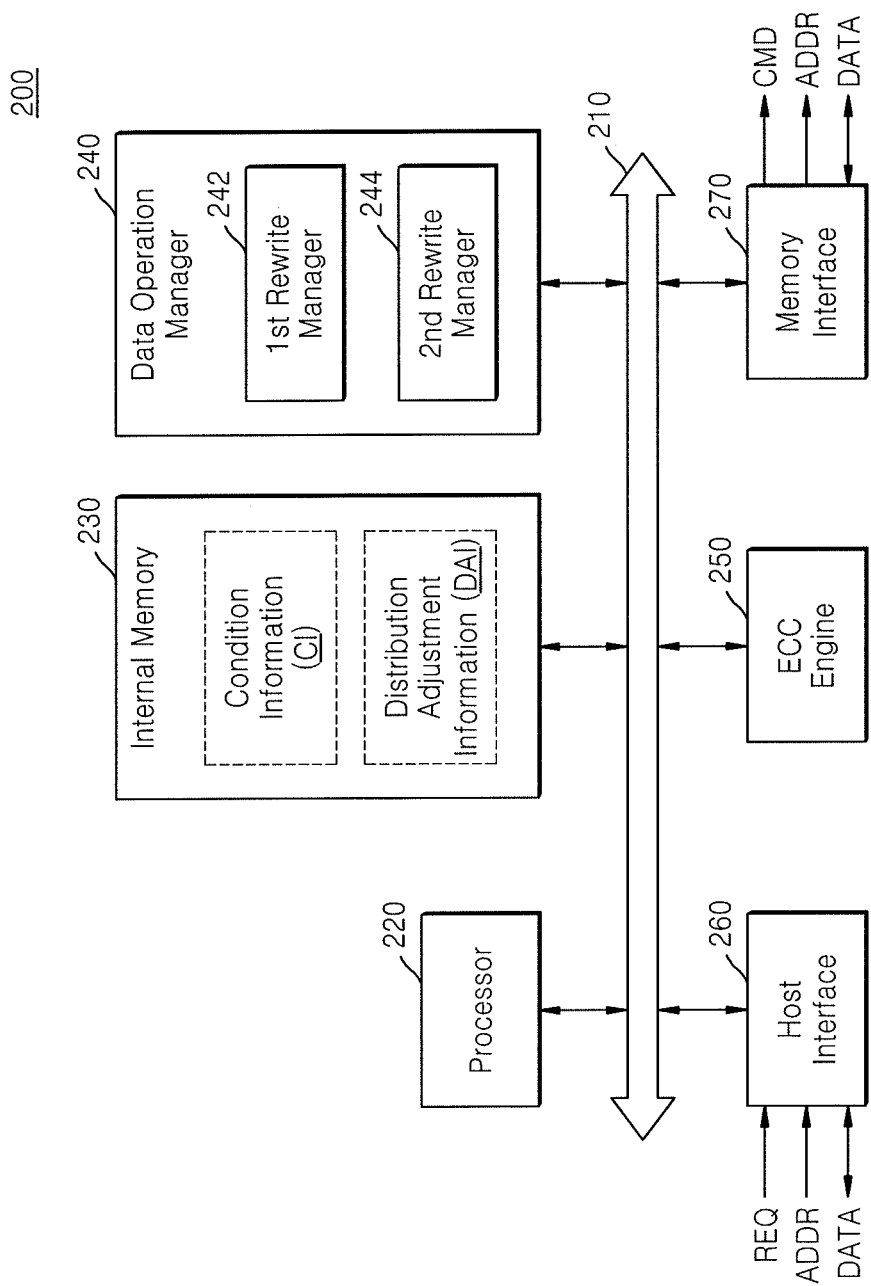
FIG. 2 illustrates a memory controller according to an example embodiment.

FIG. 2 illustrates the memory controller 200 according to an example embodiment. The memory controller 200 may include a system bus 210, the processor 220, an internal memory 230, the data operation manager 240, an Error Checking and Correcting (ECC) engine 250, a host interface 260, and a memory interface 270. The memory controller 200 may further include various components, e.g., a command generating module that generates commands CMD for controlling memory operations. Regarding the memory controller 200, descriptions previously given with reference to FIG. 1 will be omitted. FIG. 2 is described with reference to FIG. 1.

The system bus 210 may provide a channel between internal components of the memory controller 200. The system bus 210 may be operated based on one of various bus protocols.

The processor 220 may control all operations of the memory controller 200. The processor 220 may include at least one processing device, e.g., a Central Processing Unit (CPU), a Micro-Processing Unit (MCU), and the like. The processor 220 may drive software and/or firmware to control the memory controller 200. For example, a portion of the software and/or firmware may be loaded in the internal memory 230 and be driven by the processor 220.

The internal memory 230 may be used as one of various memories, e.g., an operation memory, a buffer memory, a cache memory, and so on. For this, the internal memory 230 may be embodied in various memories, e.g., at least one of dynamic random access memory (DRAM), static random access memory (SRAM), phase-change random access memory (PRAM), a flash memory, and the like.

The internal memory 230 according to an example embodiment may store the condition information CI and the distribution adjustment information DAI. In an implementation, the control information CI may include first condition information for determining whether to perform the first rewrite operation and second condition information for determining whether to perform the second rewrite operation. The first condition information for determining whether to perform the first rewrite operation may be referred to as a first condition. The second condition information for determining whether to perform the second rewrite operation may be referred to as a second condition.

The first condition will be described in more detail with reference to FIGS. 10A and 10B, and the second condition will be described in more detail with reference to FIGS. 15 to 20. The distribution adjustment information DAI is information used for determining the distribution adjustment degree. The distribution adjustment information DAI will be described in more detail with reference to FIGS. 22A and 22B.

The data operation manager 240 may control the data operations of the memory device 300. The data operation manager 240 may include a first rewrite manager 242 and a second rewrite manager 244. The first rewrite manager 242 may control the first rewrite operation of the memory device 300. The second rewrite manager 244 may control the second rewrite operation of the memory device 300.

The data operation manager 240 may be embodied in various forms in the memory controller 200 and, according to embodiments, the data operation manager 240 may be embodied in the form of hardware or software. For example, when the data operation manager 240 is embodied in the form of hardware, the data operation manager 240 may include circuits for controlling the data operations of the memory device 300. As another example, when the data operation manager 240 is embodied in the form of software, programs (or instructions) stored in the memory controller 200 may be executed by the processor 220, and thus, the data operations may be controlled. In an implementation, the data operation manager 240 may be embodied in a combination of software and hardware, like firmware. In an embodiment, the data operation manager 240 may, completely or partially, be included in a Flash Translation Layer (FTL).

The ECC engine 250 may perform an operation of checking and correcting errors of data DATA read from the memory device 300. The operation of checking and correcting errors may be referred to as an ECC decoding operation. For example, the data DATA read from the memory device 300 may include normal data and parity data that construct a code word. The ECC engine 250 may perform the ECC decoding operation by using the parity data.

The host interface 260 may provide an interface between the host 100 and the memory controller 200. The memory controller 200 may, via the host interface 260, receive the data operation request REQ, the address ADDR, and the like from the host 100 and may exchange the data DATA with the host 100.

The memory interface 270 may provide an interface between the memory device 300 and the memory controller 200. For example, the data DATA processed by the processor 220 may be stored in the memory device 300 via the memory interface 270. Alternatively, the data DATA stored in the memory device 300 may be provided to the processor 220 via the memory interface 270. The memory controller 200 may transmit the command CMD, the address ADDR, and the like to the memory device 300 via the memory interface 270 and may also exchange the data DATA with the memory device 300.

By using the memory controller 200, the rewrite operation of the memory device 300 may be controlled based on the result of the test operation on test cells, fluctuation (or degradation) in the distribution of the memory cells may be compensated for by controlling the second rewrite operation based on the result of the normal read operation, and read errors due to the fluctuation in the distribution of the memory cells may be reduced.

In addition, the memory cells may respectively have different characteristics (e.g., a drift characteristic, a characteristic of being influenced by neighboring cells, etc.). By performing the second rewrite operation to adjust the position of the distribution considering the fluctuation (or degradation) in the future distribution, based on the result of the normal read operation, the memory controller 200 may adaptively control the characteristics of the memory cells.

Figure 3:
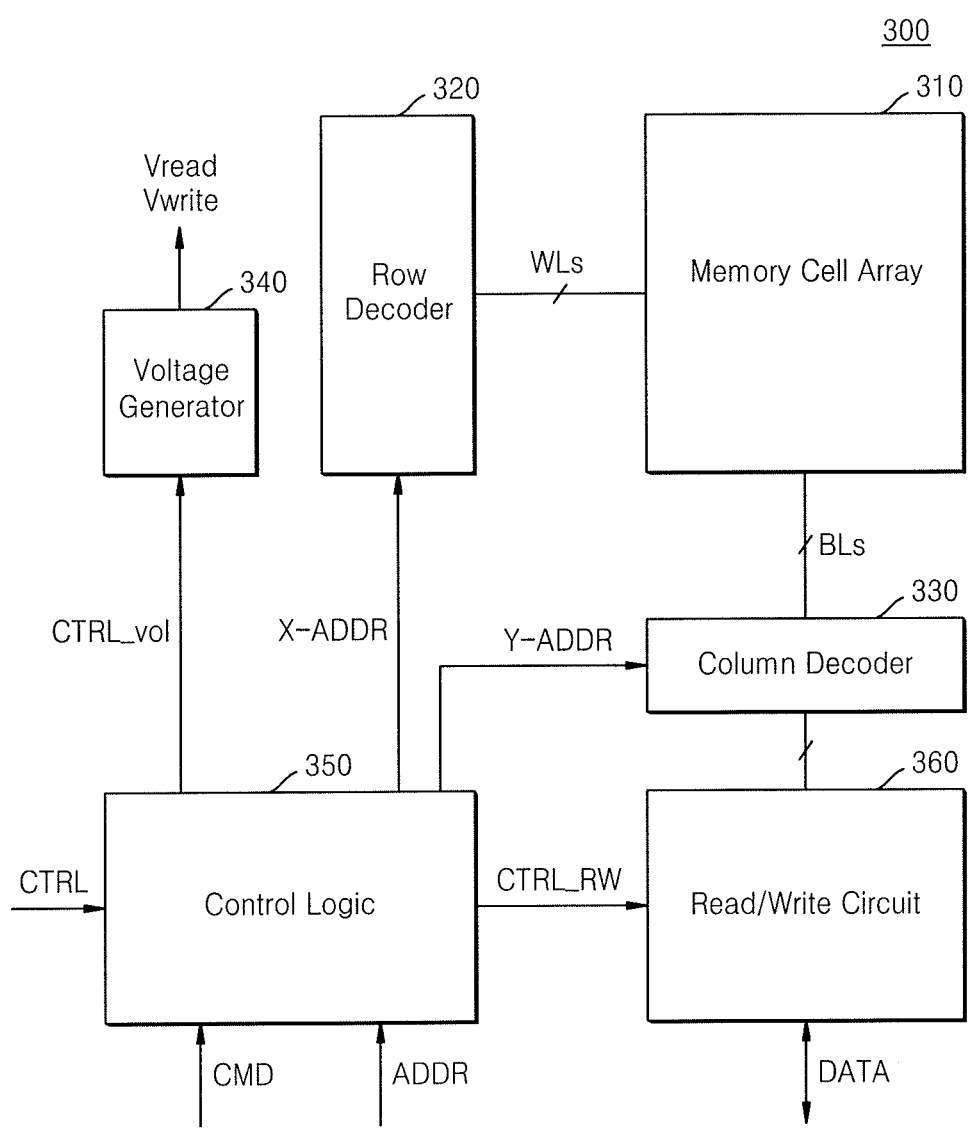
FIG. 3 illustrates a memory device according to an example embodiment.

FIG. 3 illustrates the memory device 300 according to an example embodiment. The memory device 300 may include the memory cell array 310, a row decoder 320, a column decoder 330, a voltage generator 340, a control logic 350, and a read/write circuit 360. Regarding the memory device 300 of FIG. 3, descriptions previously given with reference to FIG. 1 are omitted. FIG. 3 is described with reference to FIG. 1.

Figure 4A:
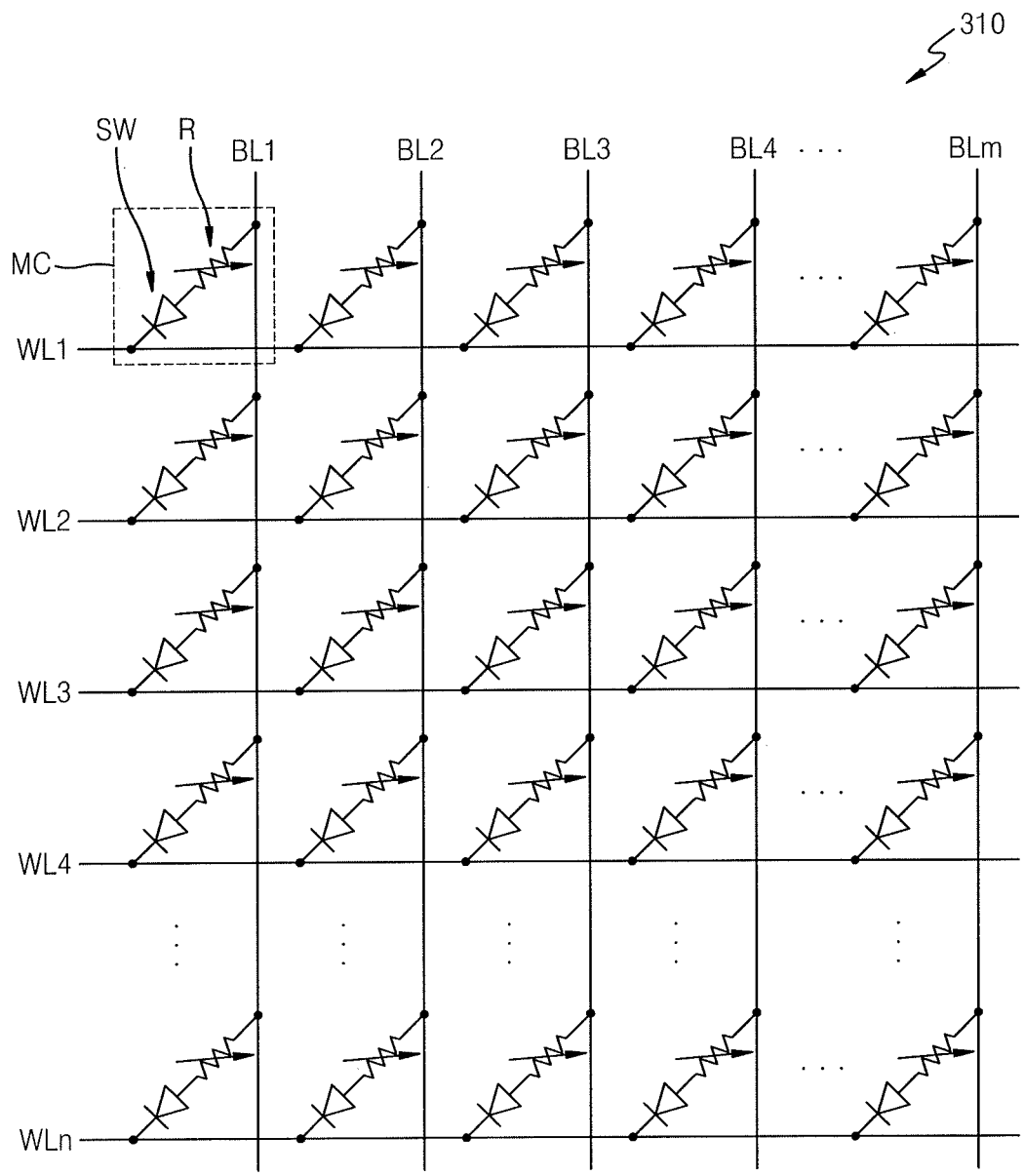
FIGS. 4A and 4B illustrate circuit diagrams as an example of a memory cell array.
Figure 4B:
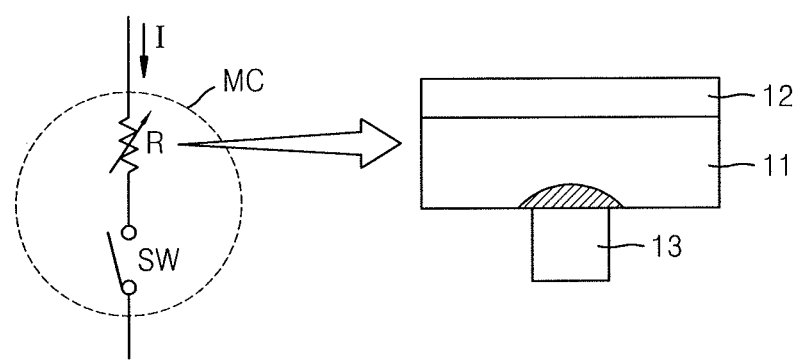

The memory cell array 310 may include a plurality of memory cells respectively located where a plurality of first signal lines and a plurality of second signal lines intersect one another. In an example embodiment, the plurality of first signal lines may be word lines WLs, and the plurality of second signal lines may be bit lines BLs. The memory device 300 including the memory cell array 310 may be referred to as a cross-point memory device. In an embodiment, the memory cell array 310 may have a same structure as shown in FIGS. 4A and 4B.

The row decoder 320 may select some of the word lines WLs based on a row address X-ADDR provided by the control logic 350. The row decoder 320 may provide a voltage to word lines. The column decoder 330 may select some of the bit lines BLs based on a column address Y-ADDR provided by the control logic 350.

The voltage generator 340 may generate various kinds of voltages needed by the memory device based on a voltage control signal CTRL_vol provided by the control logic 350. For example, the voltage generator 340 may generate a write voltage Vwrite used for the write operation and a read voltage Vread used for the read operation. The write voltage Vwrite and the read voltage Vread may be provided to the bit line and/or word line. Furthermore, in an embodiment, the voltage generator 340 may generate voltages required for the first rewrite operation and the second rewrite operation.

The control logic 350 may, based on a command CMD, an address ADDR, and a control signal CTRL received from the memory controller 200, generate various internal control signals for writing data to the memory cell array 310 or reading data from the memory cell array 310. In other words, the control logic 350 may control all operations of the memory device 300. The various internal control signals generated in the control logic 350 may be provided to the row decoder 320, the column decoder 330, the voltage generator 340, and the like. For example, the control logic 350 may provide the row address X-ADDR to the row decoder 320, the column address Y-ADDR to the column decoder 330, and the voltage control signal CTRL_vol to the voltage generator 340.

The read/write circuit 360 may perform a read operation and a write operation on the memory cells. The read/write circuit 360 may be connected to the memory cells through the bit lines BL and may include a write driver for writing data to the memory cells, and a sense amplifier.

FIG. 3 illustrates a case in which the read/write circuit 360 is connected to the memory cell array 310 via the bit lines BLs. However, according to embodiments, the read/write circuit 360 may be connected to the memory cell array 310 via the word lines WLs. In this case, that the signal lines connected to the read/write circuit 360 are not the bit lines BLs, but the word lines WLs.

The memory device 300 according to an example embodiment may, under control of the memory controller 200, perform the test read operation, the first rewrite operation, the normal read operation, and the second rewrite operation.

The memory device 300 performs the first rewrite operation based on the result of the test read operation on the test cells and performs the second write operation based on the result of the normal read operation. Thus, the fluctuation (or degradation) in the distribution of the memory cells may be compensated and read errors occurring due to the fluctuation in the distribution of the memory cells may be reduced.

The memory cells may respectively have different characteristics. By performing the second rewrite operation based on the result of the normal read operation to adjust the position of the distribution considering the fluctuation (or degradation) in the future distribution, the memory controller 200 may adaptively control the characteristics of the memory cells.

FIGS. 4A and 4B illustrate circuit diagrams of an embodiment of the memory cell array 310. FIGS. 4A and 4B each illustrate a case in which the memory cell is PRAM. The memory cell array 310 shown in FIG. 4A may correspond to a cell block.

The memory cell array 310 may be a two-dimensional memory cell array having a horizontal structure including a plurality of word lines WL1 through WLn, a plurality of bit lines BL1 through BLm, and a plurality of memory cells MC. The memory cell array 310 may include a plurality of memory blocks. In each memory block, a plurality of memory cells may be arranged in rows and columns. Here, the number of word lines WLs, the number of bit lines BLs, and the number of memory cells MC may be variously modified according. In an implementation, the memory cell array 310 may be a three-dimensional memory cell array having a vertical structure.

According to the embodiment, the plurality of memory cells MC may each include a variable resistor device R and a switching device SW. Here, the variable resistor device R may be referred to as a variable resistor material and the switching device SW may be referred to as a selection device.

In an embodiment, the variable resistor device R is connected between one of the plurality of bit lines BL1 through BLm and the switching device SW, and the switching device SW may be connected between the variable resistor device R and one of the plurality of word lines WL1 through WLn. However, in an implementation, the switching device SW may be connected between one of the plurality of bit lines BL1 through BLm and the variable resistor device R, and the variable resistor device R may be connected between the switching device SW and one of the plurality of word lines WL1 through WLn.

The switching device SW may be connected between one of the plurality of word lines WL1 through WLn and the variable resistor device R, and may control a current supply to the variable resistor device R in response to a voltage applied to the word line and the bit line connected to the variable resistor device R. FIG. 4A shows a case in which the switching device SW is a diode, but any appropriate switching device may be used.

Referring to FIG. 4B, the memory cell MC may include the variable resistor device R and the switching device SW. The switching device SW may be embodied by using various devices such as a transistor or diode. The variable resistor device R may include a phase change layer 11 including a combination of germanium (Ge), antimony (Sb), and tellurium (Te) (GST), an upper electrode 12 on the phase change layer 11, and a lower electrode 13 under the phase change layer 11.

The upper electrode 12 and the lower electrode 13 may each include various kinds of metals, metal oxides, metal nitrides, or the like. The upper electrode 12 and the lower electrode 13 may each include aluminum (Al), copper (Cu), titanium nitride (TiN), titanium-aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), strontium zirconate oxide ($StZrO_3$), and the like.

The phase change layer 11 may include a bipolar resistance memory material or a unipolar resistance memory material. The bipolar resistance memory material may be programmed into a set-state or a reset-state due to polarity of the material. Perovskite-based materials may be used for the bipolar resistance memory material. The unipolar resistance memory material may be programmed into the set-state or the reset-state by current having a same polarity, and a transition metal oxide, e.g., NiOx, TiOx, or the like, may be used for the unipolar resistance memory material.

The GST material may be programmed between an amorphous state having a relatively high resistivity and a crystalline state having a relatively low resistivity. The GST material may be programmed by heating. A magnitude and duration of heating may determine whether the GST material remains in the amorphous or crystalline state. The high resistivity and low resistivity may be represented by programmed values of logic "0" and logic "1", respectively, and may be detected by measuring the resistivity of the GST material. Conversely, the high resistivity and low resistivity may be represented by the programmed values of logic "1" and logic "0", respectively.

In FIG. 4B, when a write current I is applied to the memory cell MC, the applied write current I flows through the lower electrode 13. When the write current I is applied to the memory cell MC for a very short period of time, only a layer adjacent to the lower electrode 13 is heated by Joule's heat. At this time, due to a difference in heating profile, some of the phase change layer 11 may be in the crystalline state (or the set state) or the amorphous state (or the reset state).

Figure 5A:
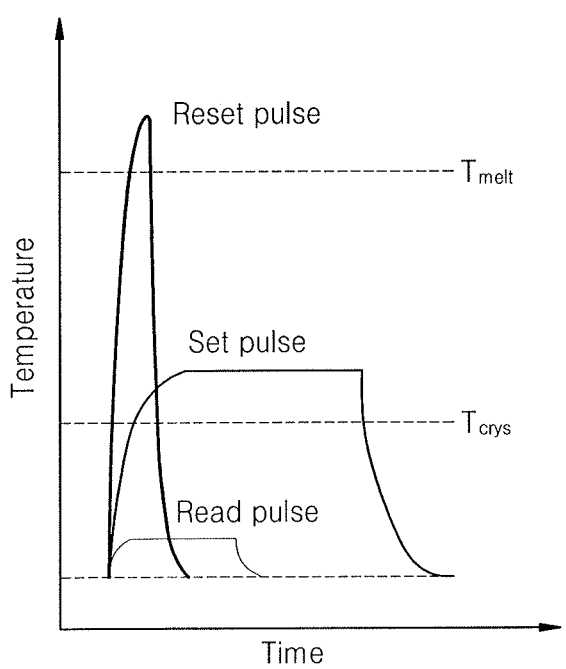
FIGS. 5A through 5C each illustrate a graph of pulses according to time, the pulses for a normal reset operation, a normal set operation, and a normal read operation.
Figure 5B:
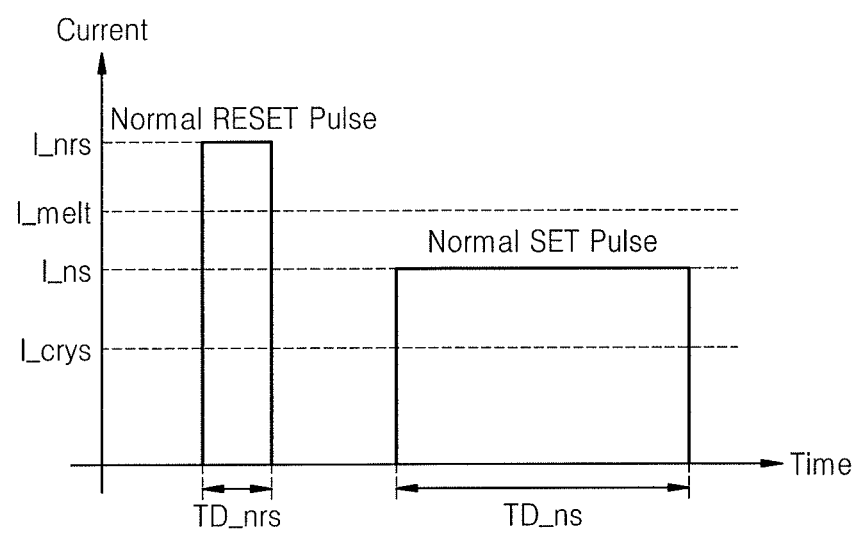
Figure 5C:
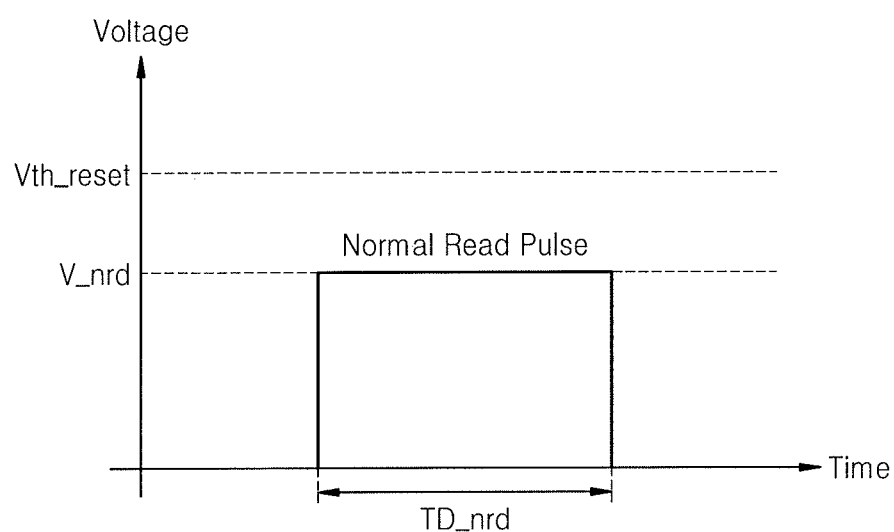

FIGS. 5A through 5C each illustrate a graph of pulses over time for a normal reset operation, a normal set operation, and a normal read operation. FIGS. 5A through 5C are described with reference to FIGS. 1 through 4B.

FIG. 5A particularly illustrates a time-temperature graph of memory cells in a write operation and a read operation. The write operation may include a reset operation and a set operation. Referring to FIG. 5A, in the reset operation, to make the phase change layer 11 be in the amorphous state (or a "RESET" state), a reset pulse is applied to the memory cell MC for a short period of time and then is removed. As the reset pulse is applied to the memory cell MC, a temperature of the memory cell MC becomes equal to or higher than a melting point Tmelt. When the reset pulse is removed, the temperature of the memory cell MC drops. In the set operation, to make the phase change layer 11 be in the crystalline state (or a "SET" state), a set pulse having a low level is applied to the memory cell MC, and the applied set pulse is removed after a period of time such that the phase change layer 11 is crystallized. As the set pulse is applied to the memory cell MC, the temperature of the memory cell MC becomes equal to or higher than a crystallization temperature Tcrys. As the set pulse is removed from the memory cell MC, the temperature of the memory cell MC drops. Therefore, based on the method above, the memory cell MC is set as one of the crystalline state or the amorphous state. A level of the read pulse may be lower than those of the set pulse and the reset pulse.

FIG. 5B particularly illustrates a time-current graph of the normal reset pulse for the normal reset operation and the normal set pulse for the normal set operation. To generate a temperature pulse as shown in FIG. 5A, a pulse-type current as shown in FIG. 5B has to be applied to the memory cell MC. Throughout the specification, a level of the pulse may indicate a height of the pulse, and the duration of the pulse may indicate a time over which the pulse is maintained, e.g., a width of the pulse. The duration of the pulse may also be referred to as a time duration of the pulse.

To convert the memory cell MC into the RESET state, a current corresponding to the normal reset pulse is applied to the memory cell MC. The normal reset pulse may have a normal reset current level I_nrs and a normal reset time duration TD_nrs. To convert the memory cell MC into the SET state, a current corresponding to the normal set pulse is applied to the memory cell. The normal set pulse may have characteristics of a normal set current level I_ns and a normal set time duration TD_ns. The normal set time duration TD_ns may be longer than the normal reset time duration TD_nrs, and the normal reset current level I_nrs may be higher than the normal set current level I_ns. In other words, the normal reset pulse may be higher and narrower than the normal set pulse.

FIG. 5C particularly illustrates a time-voltage graph of the normal read pulse for the read operation. To distinguish the SET state and the RESET state of the memory cell MC from each other, the memory device 300 may apply a voltage of the normal read pulse to the memory cell MC. The normal read pulse may have a normal read voltage level V_nrd and a normal read time duration TD_nrd. The normal read voltage level V_nrd may be greater than a SET state threshold voltage and less than a RESET state threshold voltage.

Figure 6A:
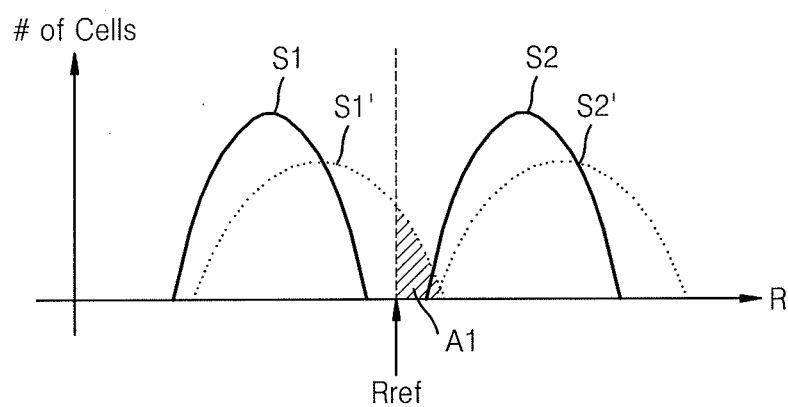
FIGS. 6A and 6B each illustrate a graph for describing degradation of a distribution.
Figure 6B:
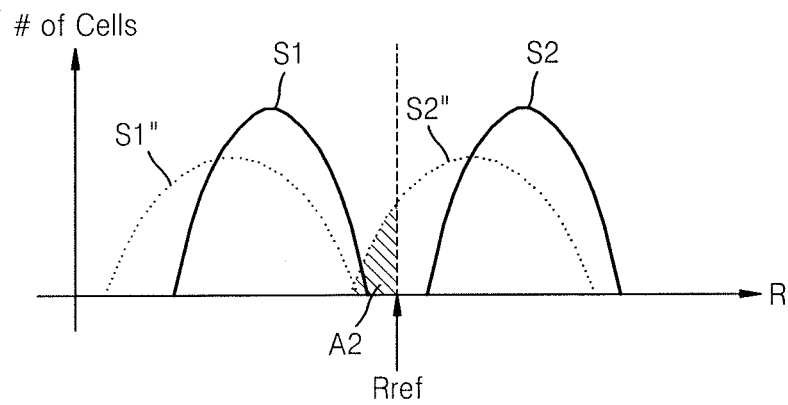

FIGS. 6A and 6B each illustrate a graph for describing degradation of distribution according to an example embodiment. The memory cells MC may indicate one of a first program state S1 and a second program state S2. The first program state S1 may be the SET state and the second program state S2 may be the reset state.

FIG. 6A particularly illustrates a case in which the distribution is degraded in a direction in which a resistance value of the distribution increases, i.e., in which the distribution is degraded in the direction of a positive resistance axis. The first program state S1 and the second program state S2 may respectively be converted into a degraded first program state S1' and a degraded second program state S2'. For example, a resistance level of the memory cell may increase over time or due to continuous stress, and the increase may be referred to as a drift of resistance distribution. In FIG. 6A, when the memory device performs the read operation using a read voltage level corresponding to a reference resistance Rref, a read error may occur due to memory cells included in a first area A1. The memory cells in the first area A1 may indicate memory cells which are converted from the original set-state to the reset-state due to degradation of the resistance distribution. Each of the memory cells in the first area A1 is referred to as a set-to-reset (STR) error cell. Due to degradation of distribution as shown in FIG. 6A, the STR error cells may be generated. Thus, read errors may occur.

FIG. 6B particularly illustrates a case in which the resistance distribution is degraded in a direction in which the resistance value of the distribution decreases, i.e., in which the distribution is degraded in the direction of a negative resistance axis. The first program state S1 and the second program state S2 may respectively be converted into a degraded first program state S "and a degraded second program state S2"'. For example, over time, the resistance level of the memory cell may decrease due to the data operation performed on neighboring cells. In FIG. 6B, when the memory device performs the read operation using the read voltage level corresponding to the reference resistance Rref, a read error may occur due to memory cells included in a second area A2. The memory cells in the second area A2 may be memory cells which are converted from the original reset-state to the set-state due to the degradation of the resistance distribution. Each of the memory cells in the second area A2 is referred to as a reset-to-set (RTS) error cell. Due to degradation of distribution as shown in FIG. 6B, the RTS error cells may be generated. Thus, read errors may occur.

Figure 7:
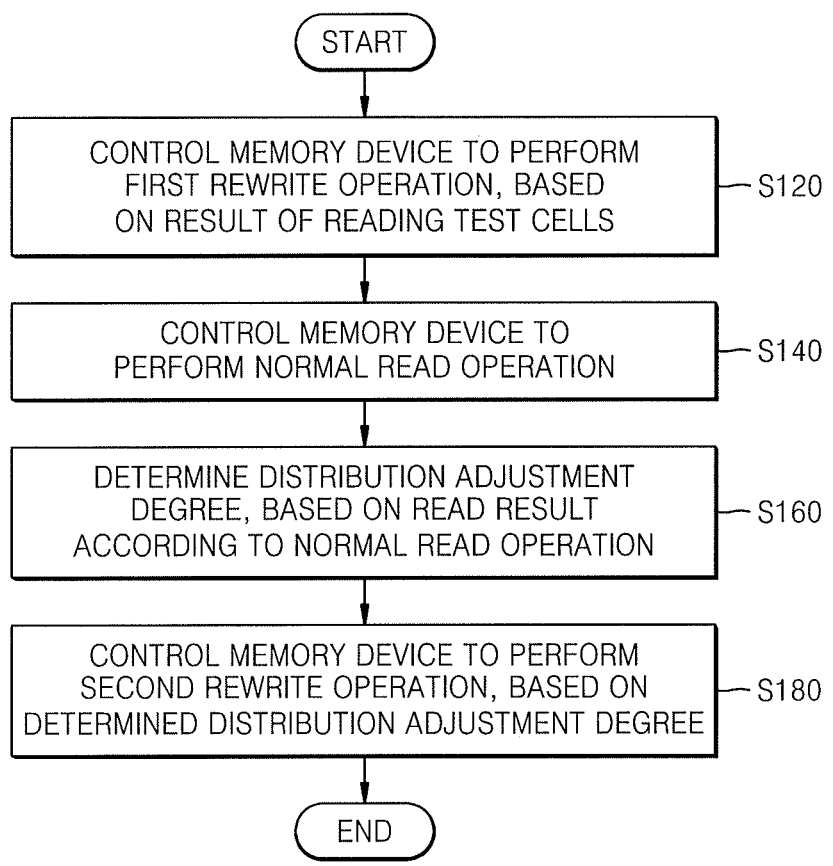
FIG. 7 illustrates a flowchart for describing a controlling method of a memory controller, according to an example embodiment.

FIG. 7 is a flowchart for describing a controlling method of the memory controller. FIG. 7 is described with reference to FIGS. 1 through 3.

In operation S120, the memory controller 200 may control the memory device 300 to perform the first rewrite operation based on the result of the read operation on the test cells. In an embodiment, when the memory system is powered on after being powered off, the memory controller 200 may control the test read operation of the memory device 300 performed on the test cells. The memory controller 200 may control the first rewrite operation of the memory device 300 based on the result of the test read operation. Operation S120 will be described in more detail with reference to FIGS. 8 through 12.

In operation S140, the memory controller 200 may control the memory device 300 to perform the normal read operation. In other words, the memory controller 200 may control the normal read operation of the memory device 300.

In operation S160, the memory controller 200 may determine the distribution adjustment degree based on the read result according to the normal read operation. In an embodiment, the memory controller 200 may identify the direction of the distribution degradation of the memory cells by using the result of the normal read operation and may determine the distribution adjustment degree such that the distribution is a direction that is opposite the direction of the distribution degradation identified based on the normal state. The memory controller 200 may determine the distribution adjustment degree by using the distribution adjustment information DAI stored in the memory controller 200.

In operation S180, the memory controller 200 may control the memory device 300 to perform the second rewrite operation based on the determined distribution adjustment degree. In other words, the memory controller 200 may control the second rewrite operation of the memory device 300. Some characteristics of the second rewrite operation may be different from those of the normal set operation and normal reset operation according to a general normal write operation. For example, in the second rewrite operation, a level and/or duration of the set pulse may be different from a level and/or duration of the normal set pulse, or a level and/or duration of the reset pulse may be different from a level and/or duration of the normal reset pulse. In an embodiment, the second rewrite operation may be performed in the DCW off mode. For example, the DCW off mode may refer to a mode in which data is written without comparing written data with data to be written.

Operations S160 and S180 will be described in more detail with reference to FIGS. 13 through 22.

Figure 8:
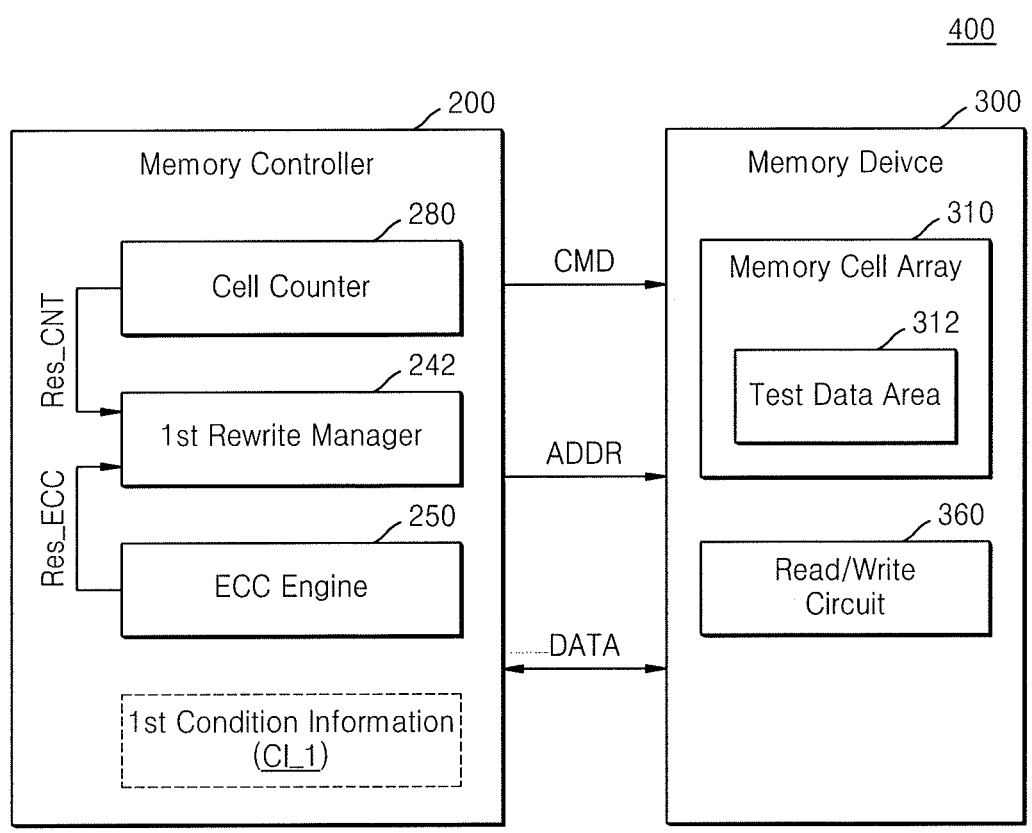
FIG. 8 illustrates a memory system according to an example embodiment.

FIG. 8 illustrates the memory system 400 according to an example embodiment. More particularly, FIG. 8 illustrates configurations of the memory systems 400 for describing operation S120 shown in FIG. 7 in more detail.

The memory controller 200 may include the first rewrite manager 242, the ECC engine 250, and a cell counter 280, and may store the first condition information CI_1. The memory cell array 310 in the memory device 300 may include a test data area 312.

The first rewrite manager 242 may, when the memory system 400 is powered on after being powered off, control the test read operation indicating a read operation on the test cells stored in the test data area 312. The read test data may be provided to the memory controller 200. In an embodiment, the ECC engine 250 may perform an ECC decoding operation by using pieces of test data and generate an ECC result Res_ECC. The ECC engine 250 may provide the ECC result Res_ECC to the first rewrite manager 242. In an embodiment, the ECC result Res_ECC may include information regarding the number of error cells. In an embodiment, the cell counter 280 may perform a cell count operation by using the pieces of test data and provide a cell count result Res_CNT to the first rewrite manager 242. The cell count result Res_CNT may include information regarding the number of on cells.

Hereinafter, the reason for performing the test read operation when the memory system 400 is powered on after being powered off is described. The memory cell array 310 includes the plurality of memory cells which are written at different times and have different characteristics. Therefore, reference cells for determining whether to perform the first rewrite operation are needed. Accordingly, the memory cell array 310 includes the test data area 312 to store the test cells and the memory device 300 performs the test read operation on the test cells. According to the embodiment, the test read operation is performed when the memory system 400 is powered on again. In an implementation, the memory controller 200 may control the memory device 300 to perform the test read operation in each predetermined time cycle.

The first rewrite manager 242 may control the first rewrite operation of the memory device 300 based on the ECC result Res_ECC and/or the cell count result Res_CNT. In an embodiment, the first rewrite manager 242 may determine whether the first condition is fulfilled by comparing the ECC result Res_ECC and/or the cell count result Res_CNT with the first condition information CI_1. When the first condition is fulfilled, the first rewrite manager 242 may control the first rewrite operation of the memory device 300. The first rewrite operation may be performed by applying a voltage corresponding to the partial rewrite pulse, to the selected memory cells. Compared to the normal read pulse, the partial rewrite pulse may have a higher voltage level and a shorter duration.

Figure 9:
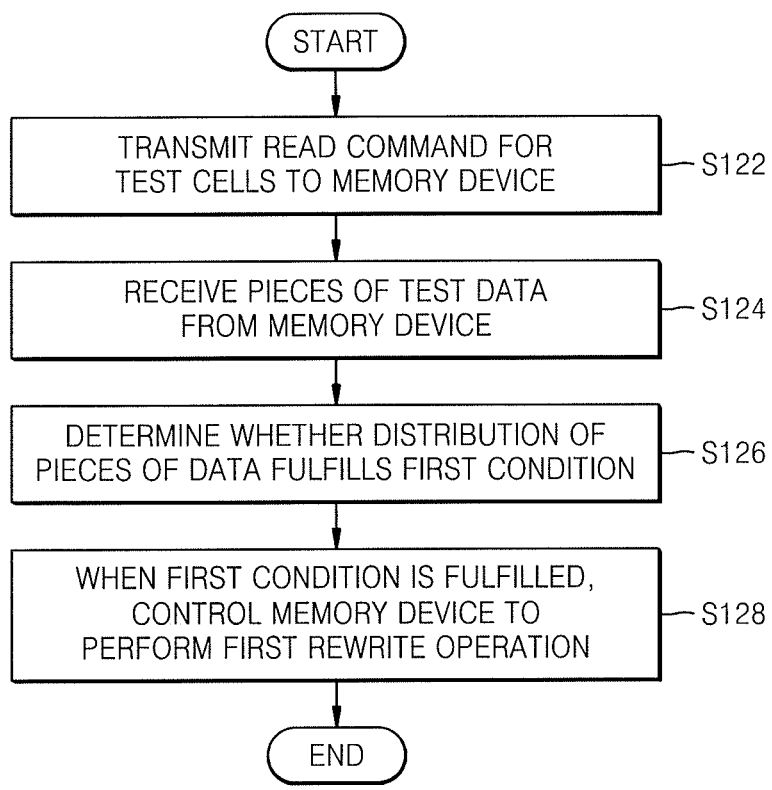
FIG. 9 illustrates a flowchart for describing a method of controlling a first rewrite operation.

FIG. 9 is a flowchart of a method of controlling the first rewrite operation. FIG. 9 may particularly be a more detailed flowchart of operation S120 in FIG. 7. FIG. 9 is described with reference to FIG. 8.

In operation S122, the memory controller 200 may transmit a read command for the test cells stored in the test data area 312 to the memory device 300. The memory device 300 may, in response to the read command, read pieces of test data from the test cells. The memory device 300 may transmit the pieces of test data to the memory controller 200.

In operation S124, the memory controller 200 may receive the pieces of test data from the memory device 300.

In operation S126, the memory controller 200 may determine whether a distribution of the pieces of test data fulfills the first condition that indicates degradation of the distribution. Whether the first condition is fulfilled will be described in more detail with reference to FIGS. 10A and 10B.

In operation S128, when the first condition is fulfilled, the memory controller 200 may control the memory device 300 to perform the first rewrite operation for compensating for the drift of the resistance distribution.

Figure 10A:
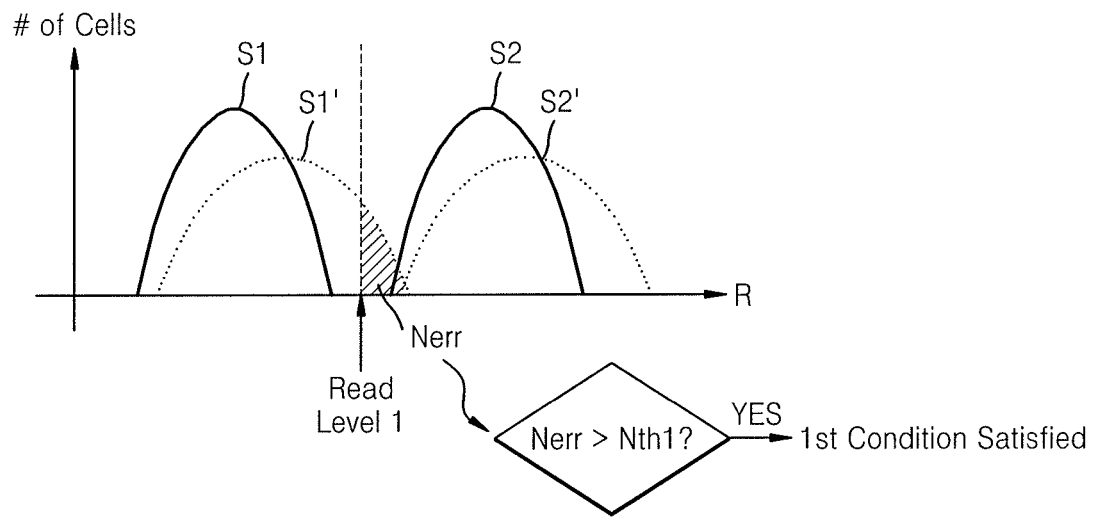
FIGS. 10A and 10B each illustrate a distribution of memory cells for describing a first condition.
Figure 10B:
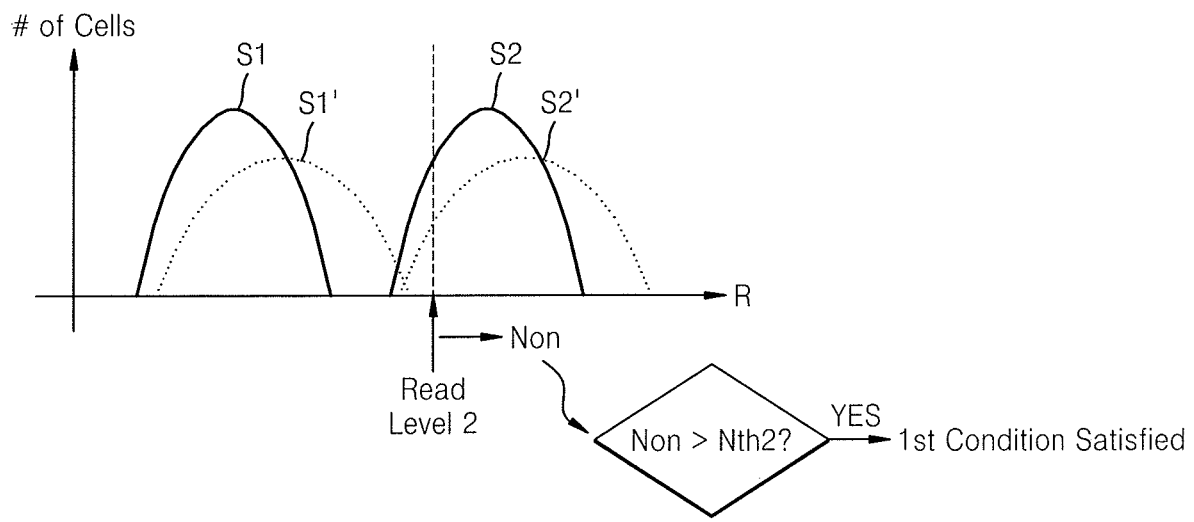

FIGS. 10A and 10B each illustrate a distribution of the memory cells for describing the first condition according to an example embodiment. FIGS. 10A and 10B are described with reference to FIG. 8.

FIG. 10A illustrates a method of determining whether the first condition is fulfilled when the drift occurs in the distribution of the resistances of the memory cells. When the resistance distribution in the first program state S1 is degraded and changed into the resistance distribution in the degraded first program state S1', the ECC engine 250 may, after performing the ECC decoding operation on test data that is read according to the test read operation by using the first read level Read Level 1, generate the ECC result Res_ECC according to the ECC decoding operation, thereby providing the ECC result Res_ECC to the first rewrite manager 242. The ECC result Res_ECC may include the number of error cells Nerr. The first rewrite manager 242 may compare the number of error cells Nerrs with a first threshold value Nth1 that is predetermined. The first threshold value Nth1 may be included in the first condition information CI_1. The first threshold value Nth1 may be a predetermined value and may be changed depending on circumstances. When the number of error cells Nerr is greater than the first threshold value Nth1, the first rewrite manager 242 may determine that the first condition is fulfilled.

FIG. 10B describes a method of determining whether the first condition is fulfilled when the drift occurs in the resistance distribution of the memory cells. The cell counter 280 may first perform the cell count operation on the test data that is read according to the test read operation by using the second read level Read Level 2 and generate the cell count result Res_CNT according to the cell count operation, thereby providing the cell count result Res_CNT to the first rewrite manager 242. The cell count result Res_CNT may include the number of on cells Non. Here, an on cell may be a cell having a resistance value greater than a resistance of a reference level. The first rewrite manager 242 may compare the number of on cells Non with a second threshold value Nth2 that is predetermined. The second threshold value Nth2 may be included in the first condition information CI_1. The second threshold value Nth2 may be a predetermined value and may be changed depending on circumstances. When the number of on cells Non is greater than the second threshold value Nth2, the first rewrite manager 242 may determine that the first condition is fulfilled.

Figure 11:
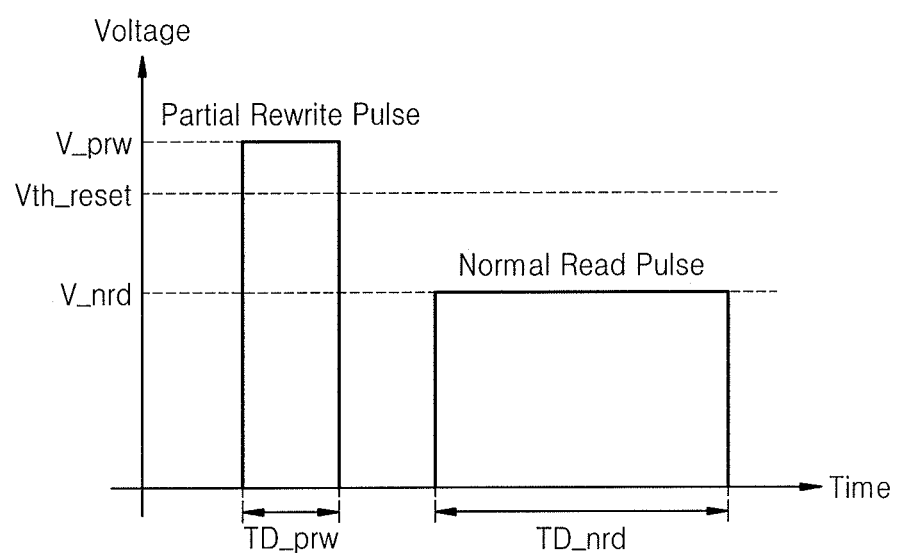
FIG. 11 illustrates a graph of a partial rewrite pulse and a normal read pulse according to time, according to an example embodiment.

FIG. 11 illustrates a graph of a partial rewrite pulse and a normal read pulse over time according to an example embodiment. FIG. 11 particularly illustrates a voltage pulse applied to the selected memory cell by the read/write circuit 360, in operation S128 described with reference to FIG. 9. FIG. 11 is described with reference to FIG. 8.

The first rewrite operation may also be referred to as a partial rewrite operation. The partial rewrite pulse applied to selected memory cells in the first rewrite operation, compared to the normal read pulse, may have a higher voltage level and a shorter duration. In other words, assuming that the partial rewrite pulse has characteristics of a partial rewrite voltage level V_prw and a partial rewrite time duration TD_prw, the partial rewrite voltage level V_prw may be higher than the normal read voltage level V_nrd and the partial rewrite time duration TD_prw may be shorter than the normal read time duration TD_nrd. In an embodiment, the partial rewrite voltage level V_prw may be higher than a reset-state threshold voltage level Vth_reset. A change that occurs when the partial rewrite pulse is applied to the selected memory cell is described with reference to FIG. 12.

The partial rewrite pulse may have various forms. In an implementation, the voltage level of the partial rewrite pulse may be similar to or lower than the voltage level of the normal read pulse. In other words, the partial rewrite voltage level V_prw may be similar to or lower than the normal read voltage level V_nrd. In an implementation, the duration of the partial rewrite pulse may be equal or similar to the time period consumed for precharge during the normal read operation. In an embodiment, the voltage level of the partial rewrite pulse may be lower than a voltage level of pulses used in the write operation.

Figure 12:
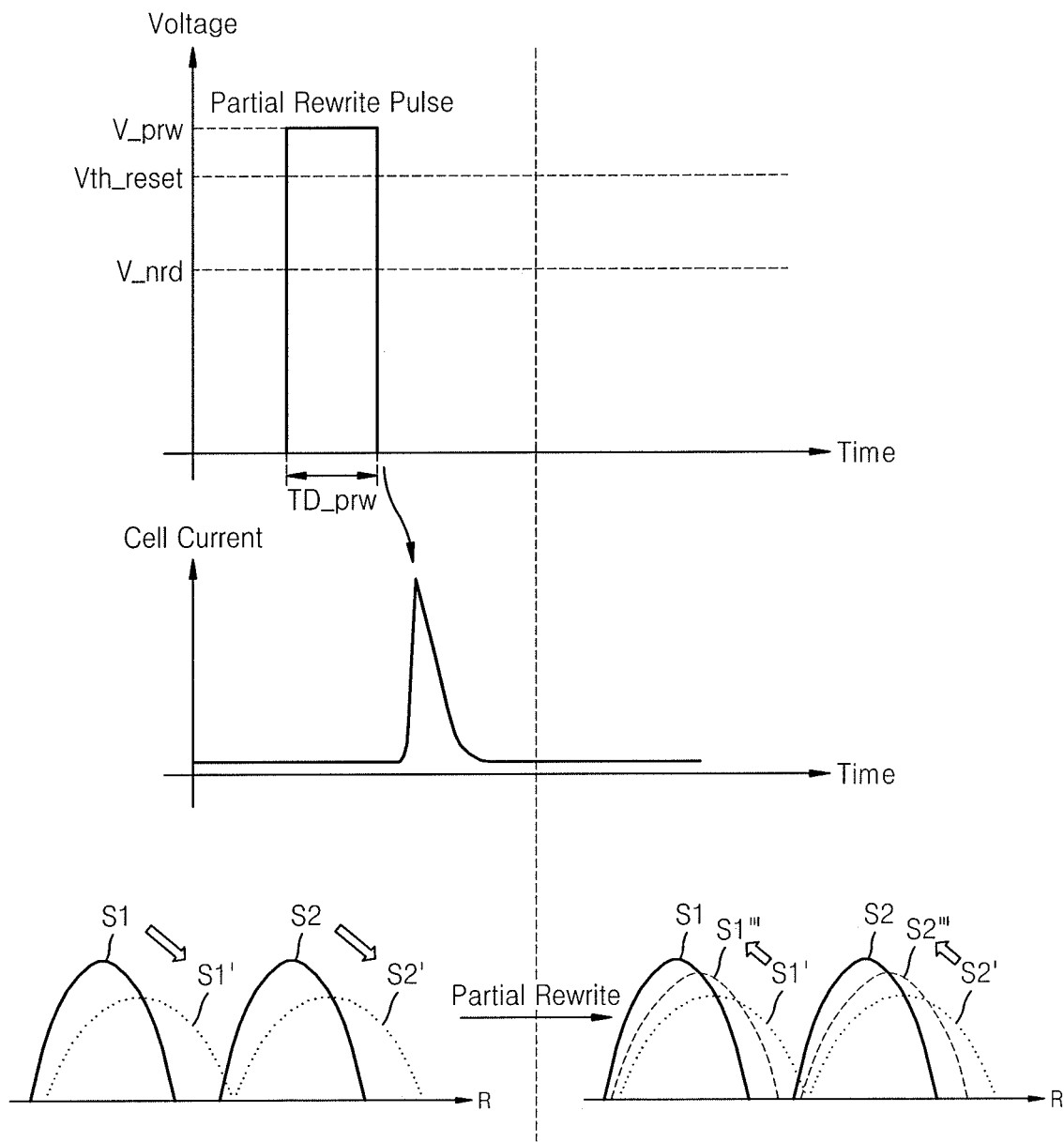
FIG. 12 illustrates a graph of a partial rewrite pulse according to time, a graph of a cell current according to time, and a change in the distribution, according to an example embodiment.

FIG. 12 illustrates a graph of a partial rewrite pulse over time, a graph of a cell current over time, and a change in the distribution, according to an example embodiment. FIG. 12 particularly shows examples of changes that occur when the rewrite pulse shown in FIG. 11 is applied to the memory cell. FIG. 12 is described with reference to FIG. 8. A case in which the resistance distributions of the selected memory cells are degraded from S1 and S2 to S1' and S2' is assumed.

After operations S122, S124, and S126 in FIG. 9, in operation S128, the data operation manager 240 may apply the partial rewrite pulse to the selected memory cells. In this case, the cells to which the partial rewrite pulse is applied may include, from among the selected memory cells, the reset-state cells and the set-state cells.

When the partial rewrite pulse is applied to the selected memory cells, a current having a pointed pulse-shape, as compared to the square pulse of the partial rewrite pulse, may be temporarily formed in the selected memory cells. As the partial rewrite voltage level V_prw is higher than the reset-state threshold voltage level Vth_reset, a current having a pulse-shape may be formed in the reset-state cells from among the selected memory cells. The current having the pointed pulse-shape, which is temporarily formed in the selected memory cells, may move the resistance distribution of the set-state cells from among the selected memory cells from S1' to S1''' and move the resistance distribution of the reset-state cells from among the selected memory cells from S2' to S2'''. In other words, through the first rewrite operation, the first rewrite manager 242 may compensate for the drift occurred in the memory cell array 310.

Figure 13:
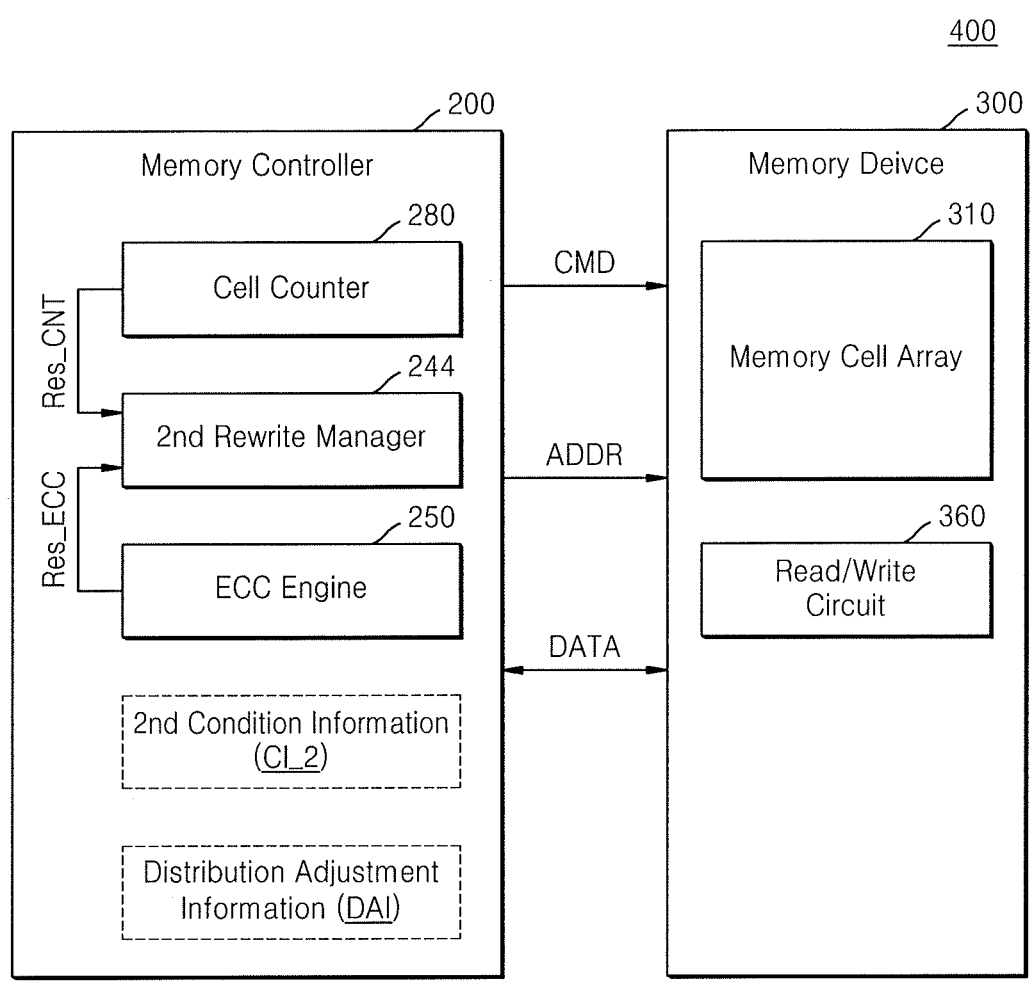
FIG. 13 illustrates a memory system according to an example embodiment.

FIG. 13 illustrates the memory system 400 according to an example embodiment. More particularly, FIG. 13 illustrates configurations of the memory system 400 for describing operation S160 of FIG. 7 in more detail.

The memory controller 200 may include the second rewrite manager 244, the ECC engine 250, and the cell counter 280, and may also store the second condition information CI_2 and the distribution adjustment information DAI.

The second rewrite manager 244 may determine the distribution adjustment degree by using the result of the normal read operation in operation S140 shown in FIG. 7, and may, based on the determined distribution adjustment degree, control the second rewrite operation of the memory device 300. In an embodiment, the ECC engine 250 may perform an ECC decoding operation using the pieces of data read from the normal read operation and generate an ECC result Res_ECC. The ECC engine 250 may provide the ECC result Res_ECC to the second rewrite manager 244. In an embodiment, the ECC result Res_ECC may include the number of the STR error cells and the number of RTS error cells. In an embodiment, the cell counter 280 may perform a cell counter operation using the pieces of data read in the normal read operation and provide the cell count result Res_CNT to the second rewrite manager 244. The cell count result Res_CNT may include information regarding the number of on cells.

The second rewrite manager 244 may determine the distribution adjustment degree based on the ECC result Res_ECC and/or the cell count result Res_CNT, and may control the second rewrite operation of the memory device 300 in accordance therewith. In an embodiment, the second rewrite manager 244 may determine the distribution adjustment degree by using the distribution adjustment information DAI. In an embodiment, the second rewrite manager 244 may determine whether the second condition is fulfilled by comparing the ECC result Res_ECC and/or the cell count result Res_CNT with the second condition information CI_2. When the second condition is fulfilled, the second rewrite manager 244 may control the second rewrite operation of the memory device 300.

Figure 14:
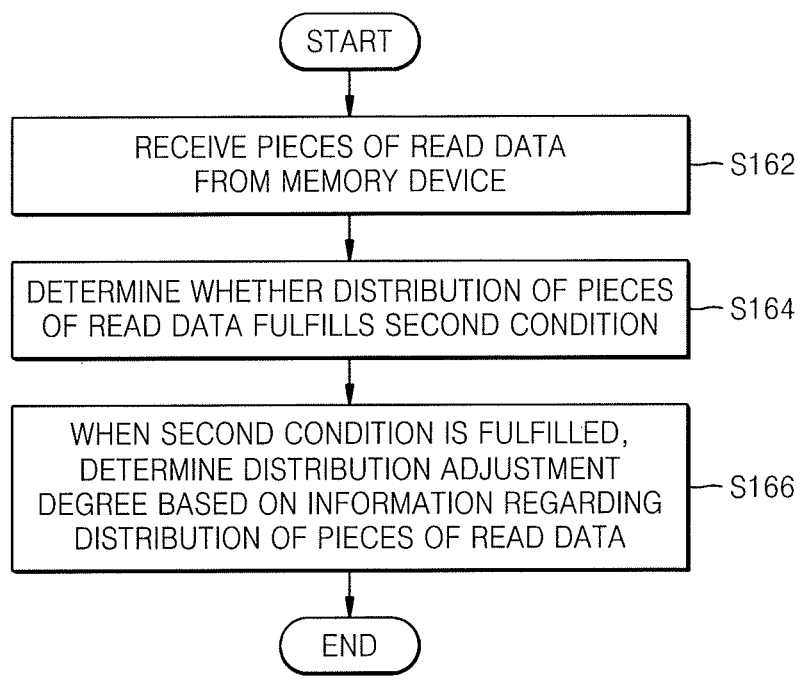
FIG. 14 illustrates a flowchart of a method of controlling a second rewriting operation.

FIG. 14 is a flowchart for describing a method of controlling the second rewriting operation. FIG. 14 may particularly be a more detailed flowchart for describing operation S160 described with reference to FIG. 7. FIG. 14 is described with reference to FIG. 13.

In operation S162, the memory controller 200 may receive the pieces of read data according to the normal read operation from the memory device 300.

In operation S164, the memory controller 200 may determine whether a distribution of the pieces of read data fulfills the second condition that indicates degradation of the distribution. Whether the second condition is fulfilled is described with reference to FIGS. 15 to 20.

In operation S166, when the second condition is fulfilled, the memory controller 200 may determine the distribution adjustment degree based on information regarding the distribution of the pieces of read data. The information regarding the distribution of the pieces of read data may include a degradation direction and degradation degree of the resistance distribution. In an implementation, the information regarding the distribution of the pieces of read data may include at least one of the number of STR error cells, the number of RTS error cells, and the number of on cells.

Figure 15:
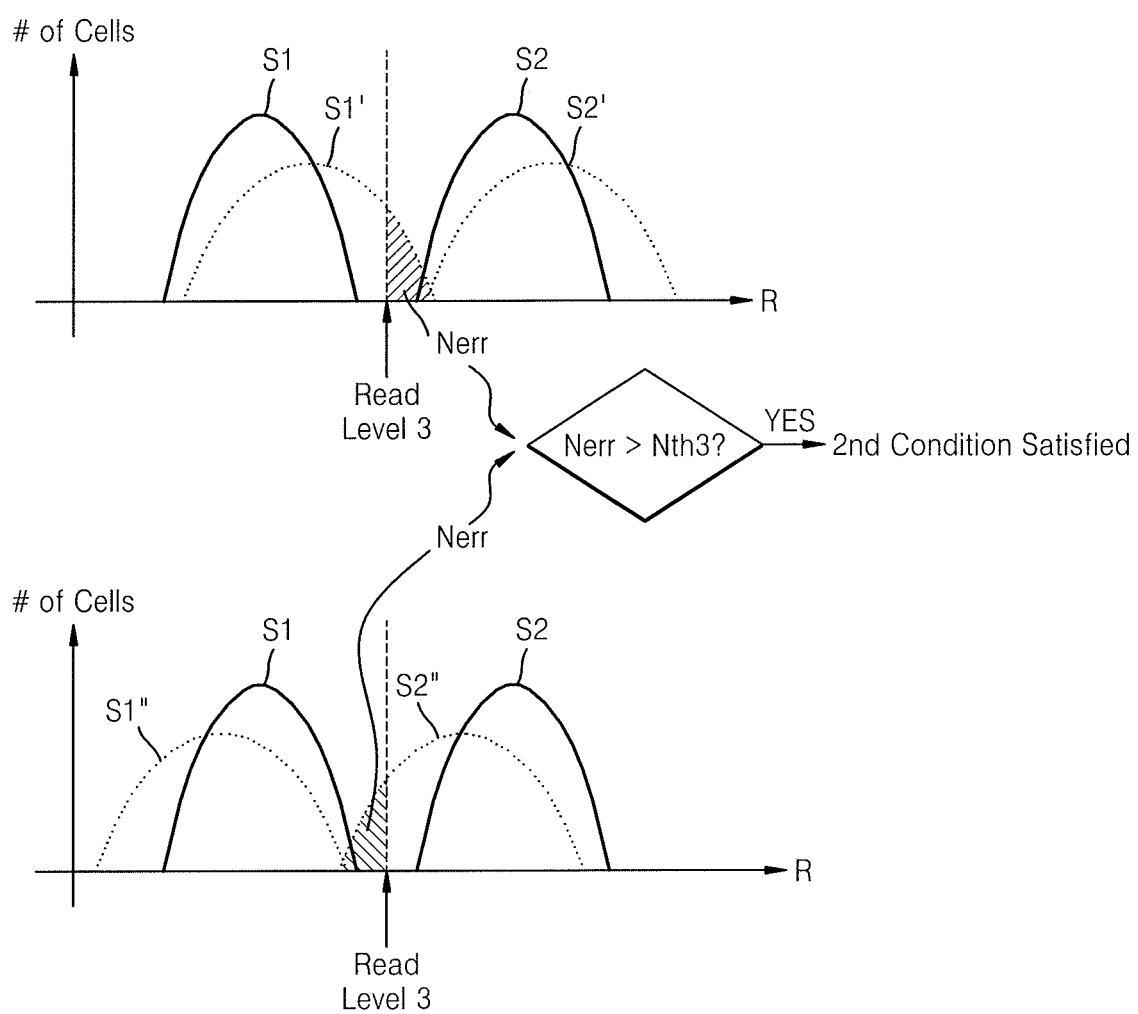
FIG. 15 illustrates a distribution of memory cells for describing a second condition, according to an example embodiment.

FIG. 15 illustrates a distribution of memory cells for describing the second condition according to an example embodiment. FIG. 15 is described with reference to FIG. 14.

The upper graph of FIG. 15 illustrates a case in which the memory cells are degraded in the direction of a positive resistance axis. The lower graph of FIG. 15 illustrates a case in which the memory cells are degraded in the direction of a negative resistance axis. In FIG. 15, it is assumed that the normal read operation is a read operation using a third read level Read Level 3. The third read level may be equal or similar to the normal read level.

Referring to the upper graph of FIG. 15, the ECC engine 250 may identify the number of error cells Nerr by performing the ECC decoding operation on the pieces of read data. More particularly, in the upper graph of FIG. 15, the error cells may indicate the STR error cells converted from the original set-state to the reset-state.

Referring to the lower graph of FIG. 15, the ECC engine 250 may identify the number of error cells Nerr by performing the ECC decoding operation on the pieces of read data. More particularly, in the lower graph of FIG. 15, the error cells may indicate the RTS error cells converted from the original reset-state to the set-state.

The second rewrite manager 244 may compare the number of error cells Nerr with the third threshold value Nth3 that is predetermined. The third threshold value Nth3 may be included in the second condition information CI_2. The third threshold value Nth3 may be a predetermined value and may be changed depending on the occasion. When the number of error cells Nerr is greater than the third threshold value Nth3, the second rewrite manager 244 may determine that the second condition is fulfilled.

Figure 16:
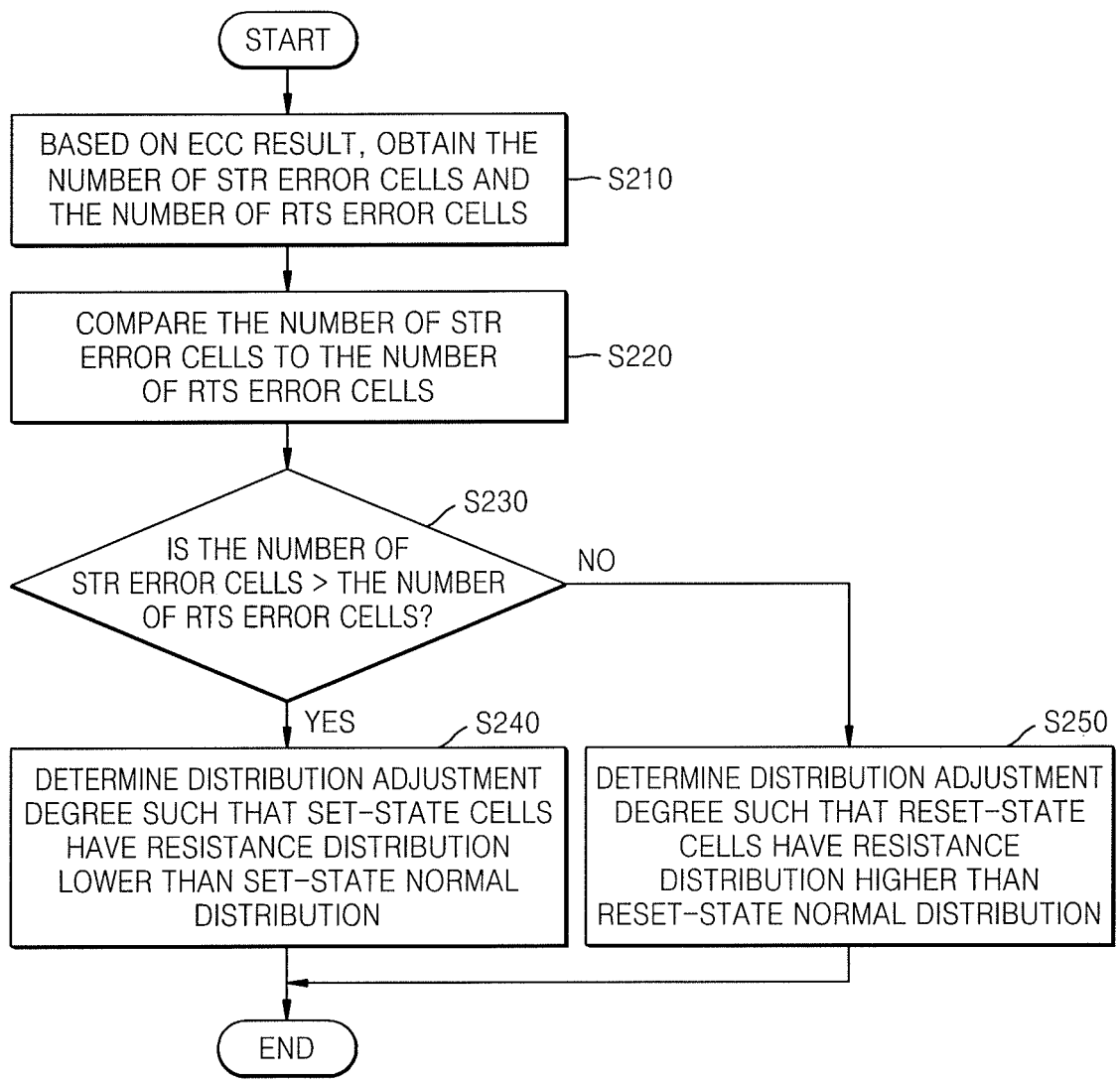
FIG. 16 illustrates a flowchart of a method of controlling a second rewrite operation.

FIG. 16 is a flowchart for describing a method of controlling the second rewrite operation. FIG. 16 may, when the second rewrite operation is controlled using the number of error cells, particularly be a more detailed flowchart for describing operation S166 described with reference to FIG. 14. FIG. 16 is described with reference to FIG. 14.

In operation S210, based on the ECC result Res_ECC received from the ECC engine 250, the memory controller 200 may obtain the number of STR error cells converted from the original set-state to the reset-state and the number of RTS error cells converted from the original reset-state to the set-state.

In operation S220, the memory controller 200 may compare the number of STR error cells with the number of RTS error cells.

In operation S230, according to whether the number of STR error cells is greater than the number of RTS error cells, different methods of performing the second rewrite operation may be determined. In other words, when there are more STR error cells than RST error cells, a set pulse may be adjusted or adapted for the second rewrite operation and, when there are more RST error cells than STR error cells, a reset pulse may be adjusted or adapted for the second rewrite operation.

In operation S240, when the number of STR error cells is greater than the number of RTS error cells, the memory controller 200 may determine the distribution adjustment degree such that the set-state cells have a resistance distribution lower than the set-state normal distribution. Operation S240 will be described in more detail with reference to FIG. 18.

In operation S250, when the number of STR error cells is not greater than the number of RTS error cells, the memory controller 200 may determine the distribution adjustment degree such that the reset-state cells have a resistance distribution that is higher than the reset-state normal distribution. Operation S250 will be described in more detail with reference to FIG. 19.

Figure 17:
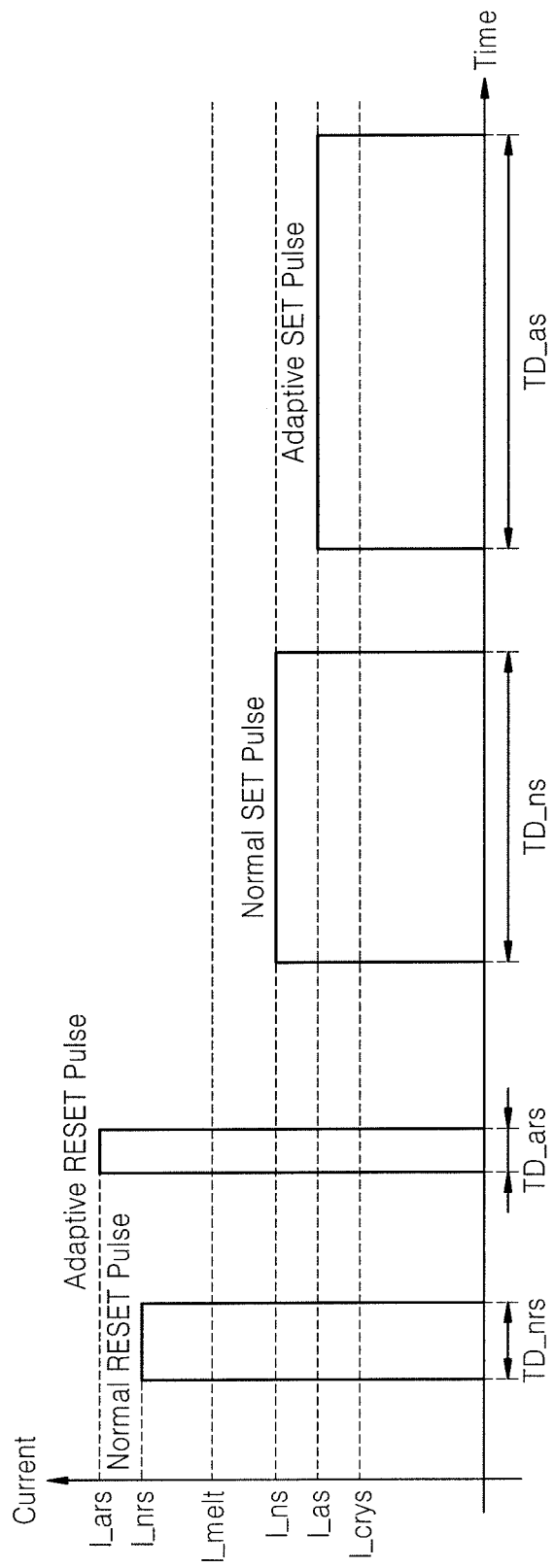
FIG. 17 illustrates a graph of an adaptive reset pulse, an adaptive set pulse, a normal reset pulse, and a normal set pulse over time.

FIG. 17 illustrates a graph of an adaptive reset pulse, an adaptive set pulse, a normal reset pulse, and a normal set pulse, according to time. FIG. 17 particularly illustrates a current applied to the selected memory cell by the read/write circuit 360, in operations S240 and S250 described with reference to FIG. 16. FIG. 17 is described with reference to FIG. 14.

The second rewrite operation may also be referred to as an adaptive rewrite operation. The adaptive reset pulse applied to the selected memory cell in the second rewrite operation may, compared to the normal reset pulse, may have a higher voltage level and a shorter duration. In other words, assuming that the adaptive reset pulse has characteristics of an adaptive reset current level I_ars and adaptive reset time duration TD_ars, the adaptive reset current level I_ars may be higher than the normal reset current level I_nrs, and the adaptive reset time duration TD_ars may be shorter than the normal reset time duration TD_nrs. The adaptive set pulse applied to the selected memory cell in the second rewrite operation may, compared to the normal set pulse, may have a lower voltage level and a longer duration. In other words, assuming that the adaptive set pulse has characteristics of an adaptive set current level I_as and an adaptive set time duration TD_as, the adaptive set current level I_as may be lower than the normal set current level I_ns, and the adaptive set time duration TD_as may be longer than the normal set time duration TD_ns. In an embodiment, the adaptive set current level I_as may be higher than a crystallization current level I_crys. A change occurring when the adaptive set pulse is applied to the selected memory cell is described with reference to FIG. 18 and a change occurring when the adaptive reset pulse is applied to the selected memory cell is described with reference to FIG. 19.

Figure 18:
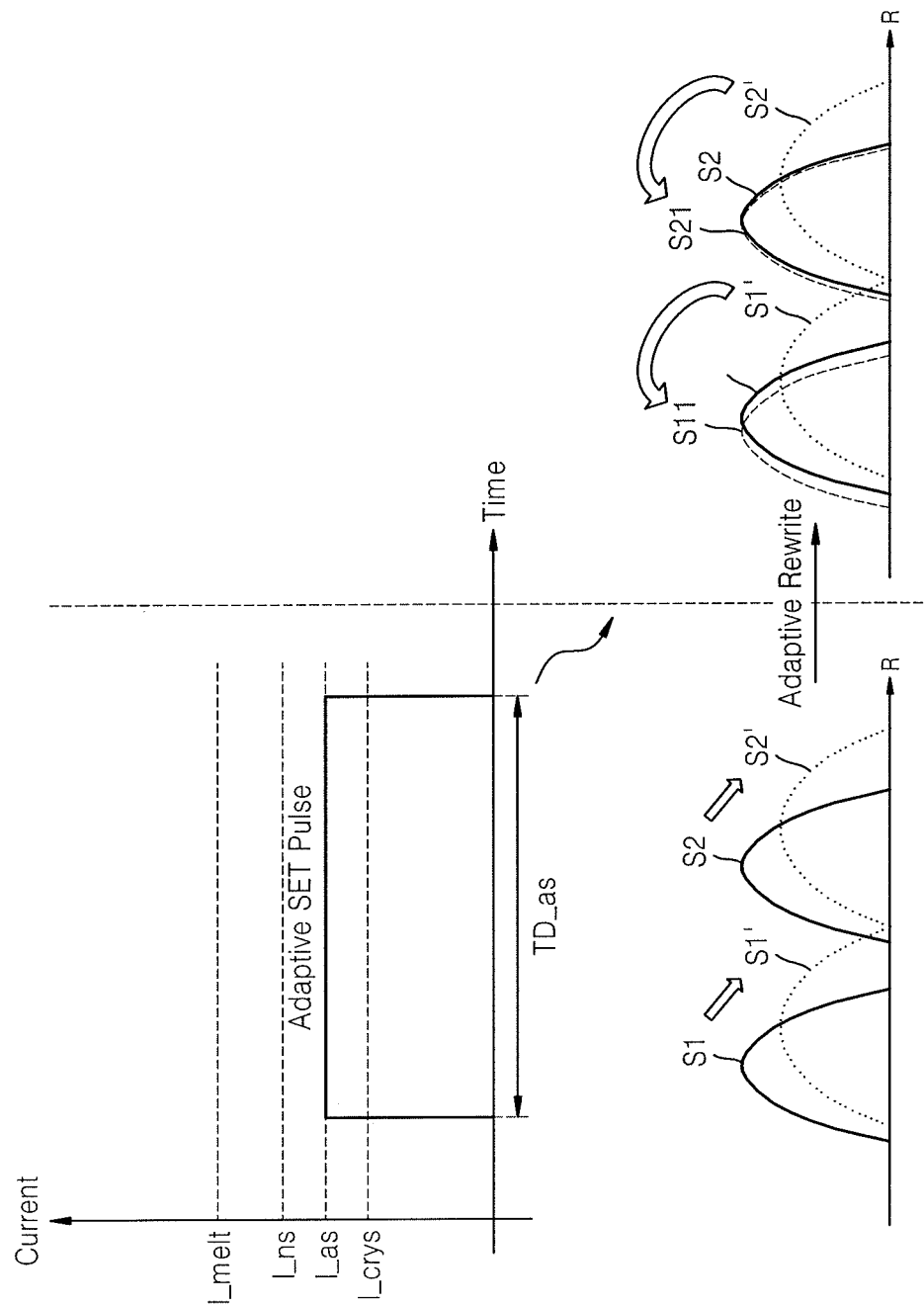
FIG. 18 illustrates a graph of the adaptive set pulse and fluctuation in a distribution over time.

FIG. 18 illustrates a graph of the adaptive set pulse and fluctuation in a distribution, according to time. FIG. 18 particularly shows a change when the adaptive set pulse shown in FIG. 17 is applied to the memory cells. FIG. 18 is described with reference to FIG. 14. A case in which the resistance distributions of the selected memory cells are degraded from S1 and S2 to S1' and S2' is assumed.

After operations S210, S220, and S230 shown in FIG. 16, in operation S240, the data operation manager 240 may apply the adaptive set pulse to the set-state memory cells, from among the selected memory cells.

When the adaptive set pulse is applied to the set-state cells from among the selected memory cells, the resistance distribution of the set-state cells from among the selected memory cells may move from S1' to S11. As a pulse having a lower level and a longer duration is applied to the set-state cells, the set-state cells may have resistance distribution lower than S1, i.e., the set-state normal distribution. In the memory cells that have moved from S1 to S1', drifts are likely to occur in the resistance distribution. The second rewrite manager 244 according to an example embodiment may form a distribution of the selected memory cells, considering drifts that may occur in the future, according to degradation tendency of the memory cells.

Meanwhile, the normal reset pulse may be applied to the reset-state cells from among the selected memory cells, and thus, the normal reset operation may be performed. Accordingly, the resistance of distribution of the reset-state cells from among the selected memory cells may move from S2' to S21. The resistance distribution of S21 may be equal to or a little lower than that of S2.

Figure 19:
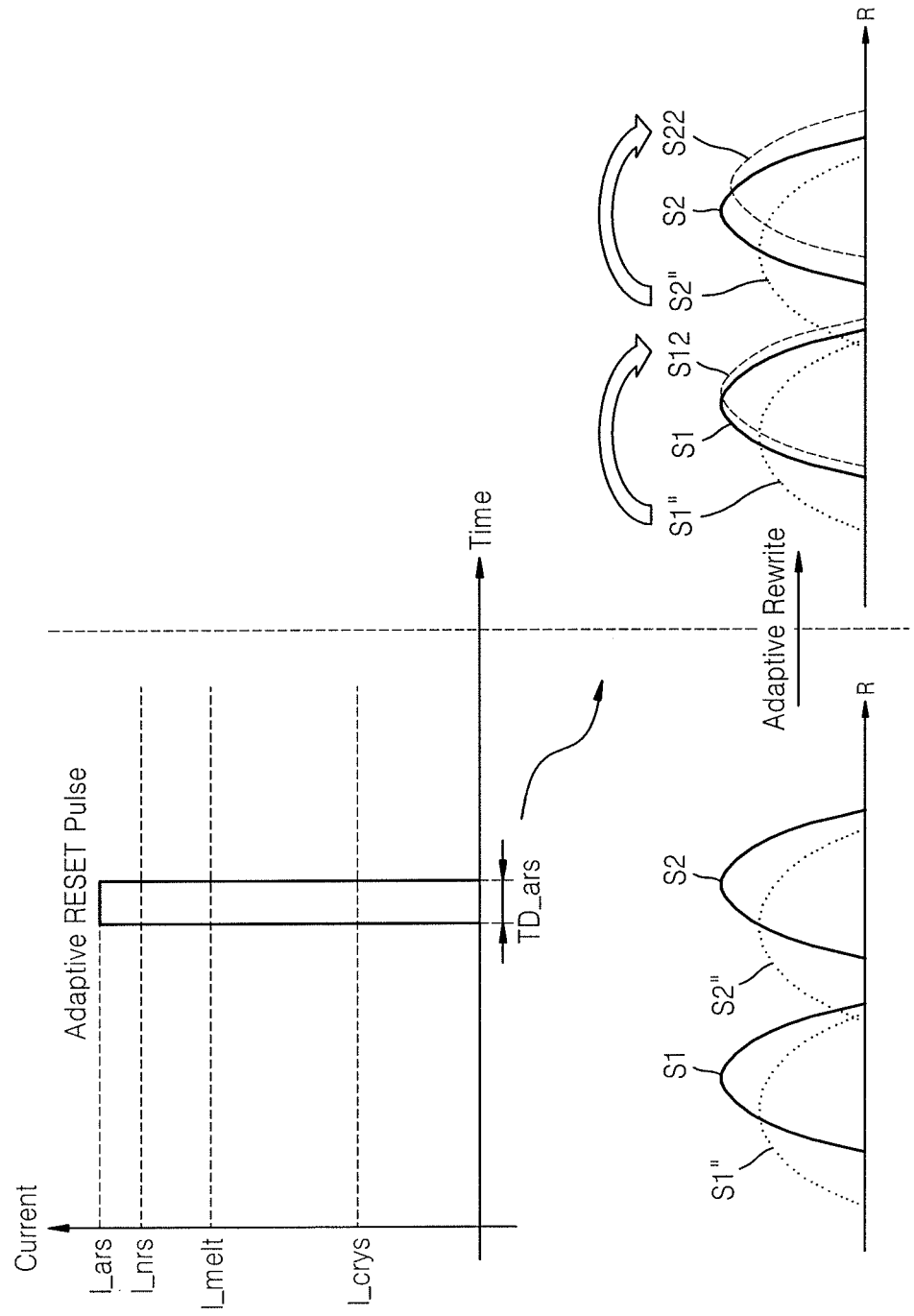
FIG. 19 illustrates a graph of the adaptive reset pulse and fluctuation in a distribution over time.

FIG. 19 illustrates a graph of the adaptive reset pulse and fluctuation in a distribution, according to time. FIG. 19 particularly shows a change that occurs when the adaptive reset pulse shown in FIG. 17 is applied to the memory cell. FIG. 19 is described with reference to FIG. 14. A case in which the resistance distributions of the selected memory cells are degraded from S1 and S2 to S1" and S2" is assumed.

After operations S210, S220, and S230 shown in FIG. 16, in operation S250, the second rewrite manager 244 may apply the adaptive reset pulse to the reset-state cells from among the selected memory cells.

When the adaptive reset pulse is applied to the reset-state cells from among the selected memory cells, the resistance distribution of the reset-state cells from among the selected memory cells may move from S2" to S22. As a pulse having a higher level and a shorter duration is applied to the reset-state cells, the reset-state cells may have a resistance distribution higher than S2, that is, the reset-state normal distribution. Empirically, in the memory cells that have moved from S2 to S2", the resistance distribution is likely degrade in the negative direction on the resistance axis hereinafter. The second rewrite manager 244 according to an example embodiment may form a distribution of the memory cells, considering degradations that may occur later.

Meanwhile, the normal set pulse may be applied to the set-state cells from among the selected memory cells, and thus, the normal set operation may be performed. Accordingly, the resistance distribution of the set-state cells from among the selected memory cells may move from S1" to S12. The resistance distribution of S12 may be equal to or a little higher than that of S1.

Figure 20:
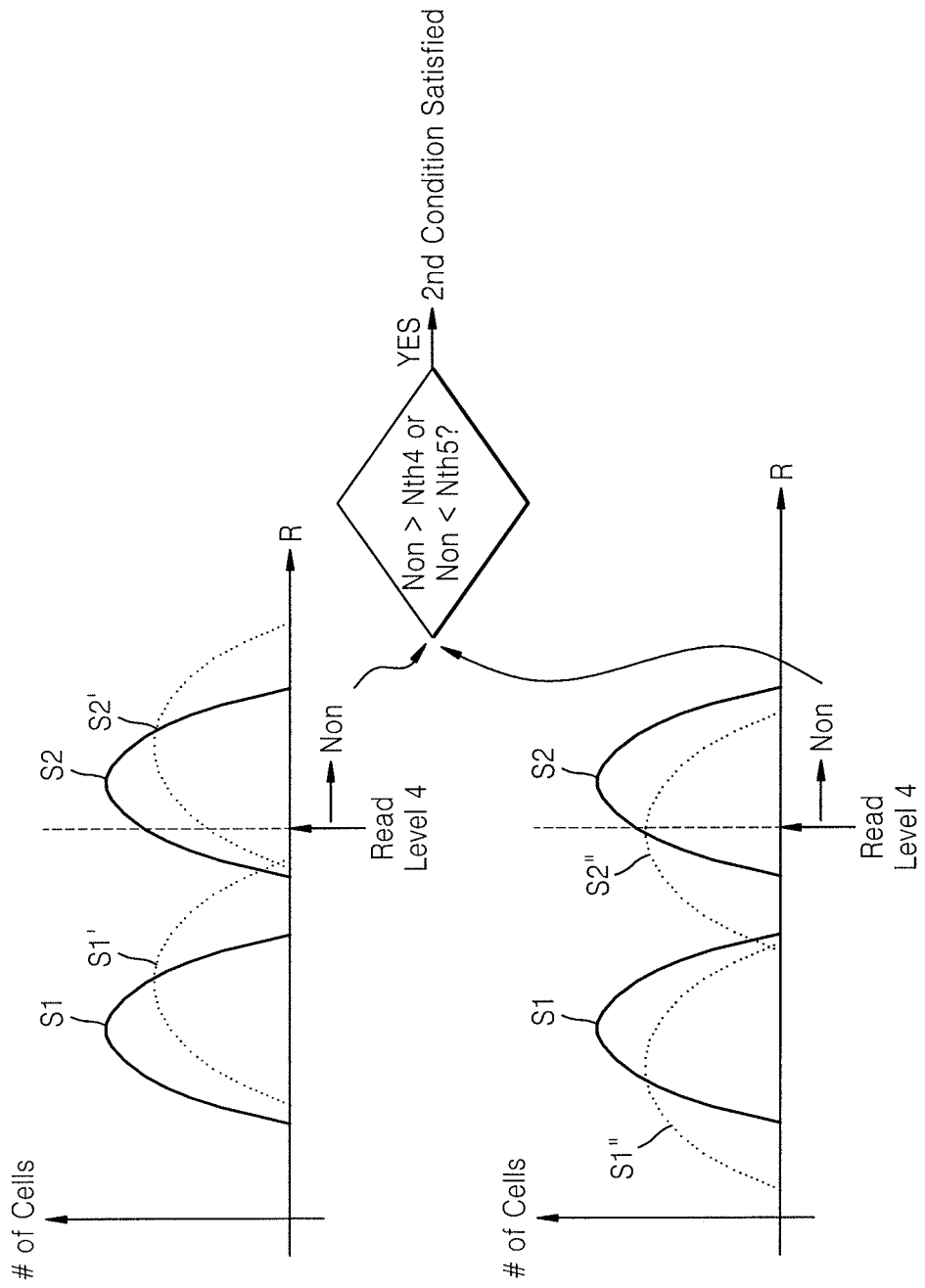
FIG. 20 illustrates a distribution of the memory cells for describing the second condition according to an example embodiment.

FIG. 20 illustrates distributions of the memory cells for describing the second condition according to an example embodiment. FIG. 20 is described with reference to FIG. 14.

The upper graph in FIG. 20 illustrates a degradation case of the memory cells corresponding to FIG. 6A, and the lower graph in FIG. 20 illustrates a degradation case of the memory cells corresponding to FIG. 6B.

Referring to the upper graph of FIG. 20, the cell counter 280 may, after performing the cell count operation on pieces of read data read from the normal read operation according to a fourth read level Read Level 4, provide a cell count result Res_CNT to the second rewrite manager 244 by generating the cell count result Res_CNT according to the cell count operation. The cell count result Res_CNT may include the number of on cells Non. The fourth read level may be higher than the normal read level.

The second rewrite manager 244 may compare the number of on cells Non with a fourth threshold value Nth4 and a fifth threshold value Nth5, which are predetermined values. The fourth threshold value Nth4 and the fifth threshold value Nth5 may be included in the second condition information CI_2. The fifth threshold value Nth5 may be less than the fourth threshold value Nth4. The fourth threshold value Nth4 and the fifth threshold value Nth5 may be predetermined values and be changed depending on the occasion. When the number of error cells Nerr is greater than the fourth threshold value Nth4 or less than the fifth threshold value Nth5, the second rewrite manager 244 may determine that the second condition is fulfilled.

Figure 21:
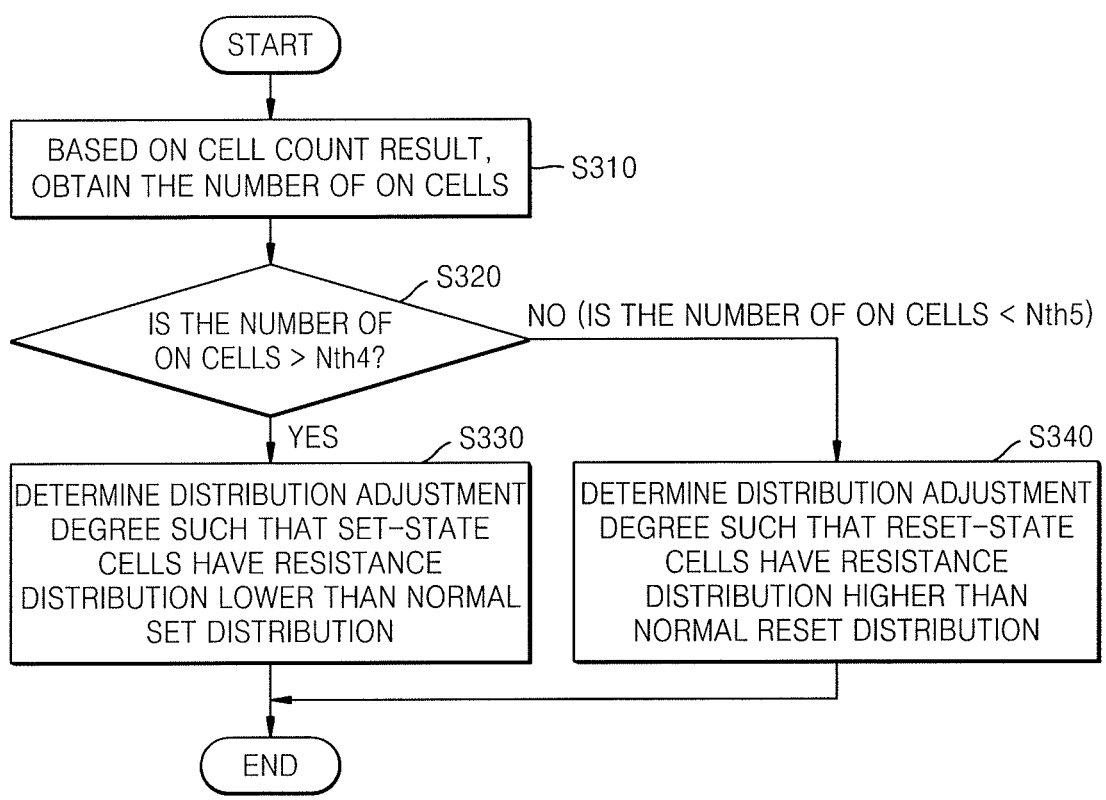
FIG. 21 illustrates a flowchart of a method of controlling a second rewrite operation.

FIG. 21 is a flowchart for describing a method of controlling the second rewrite operation. FIG. 21 may, when the second rewrite operation is controlled by using the number of on cells, particularly be a more detailed flowchart for describing operation S166 shown in FIG. 14. FIG. 21 is described with reference to FIG. 14.

In operation S310, the memory controller 200 may obtain the number of on cells, based on the cell count result Res_CNT received from the cell counter 280.

In operation S320, depending on whether the number of on cells is greater than the fourth threshold value Nth4, a different method of performing the second rewrite operation may be determined. In other words, when the number of on cells is greater than the fourth threshold value Nth4, a set pulse may be adjusted or adapted for the second rewrite operation, otherwise a reset pulse may be adjusted or adapted for the second rewrite operation In operation S330, when the number of on cells is greater than the fourth threshold value Nth4, the memory controller 200 may determine the distribution adjustment degree such that the set-state cells have resistance distribution that is lower than the set-state normal distribution. According to a result of operation S330, as shown in FIG. 18, the second rewrite operation may be performed to apply the adaptive set pulse to the set-state cells from among the selected memory cells.

In operation S340, when the number of on cells is not greater than the fourth threshold value Nth4, the memory controller 200 may determine the distribution adjustment degree such that the reset-state cells have a resistance distribution that is higher than the reset-state normal distribution. After the operation shown in FIG. 20, the number of on cells that is not greater than the fourth threshold value Nth4 may indicate that the number of on cells is less than the fifth threshold value Nth5. According to a result of operation S340, as shown in FIG. 19, the second rewrite operation may be performed to apply the adaptive reset pulse to the reset-state cells from among the selected memory cells may be performed.

FIGS. 22A and 22B show the distribution adjustment information DAI according to an example embodiment. FIG. 22A particularly shows the distribution adjustment information DAI according to the embodiments corresponding to FIGS. 15 and 16. FIG. 22B particularly shows the distribution adjustment information DAI according to the embodiments corresponding to FIGS. 20 and 21.

The second rewrite manager 244 shown in FIG. 14 may determine the distribution adjustment degree by using the distribution adjustment information DAI as shown in FIGS. 22A and 22B. For example, the second rewrite manager 244 may determine the distribution adjustment degree by comparing the ECC result Res_ECC from the ECC engine 250 with the distribution adjustment information DAI shown in FIG. 22A. As another example, the second rewrite manager 244 may determine the distribution adjustment degree by comparing the cell count result Res_CNT from the cell counter 280, with the distribution adjustment information DAI shown in FIG. 22B.

Referring to FIG. 22A, the distribution adjustment information DAI may include a table including distribution adjustment degrees each corresponding to a value of subtracting the number of RTS error cells from the number of STR error cells. The distribution adjustment degree of a negative number indicates performing the second rewrite operation such that the set-state distribution has a resistance less than that of the set-state normal distribution, as shown in FIG. 18. The distribution adjustment degree of a positive number indicates performing the second rewrite operation such that the reset-state distribution has a resistance greater than that of the reset-state normal distribution, as shown in FIG. 19. Hereinafter, for convenience of explanation, the value of subtracting the number of RTS error cells from the number of STR error cells is referred to 'a gap between the numbers of error cells'.

The distribution adjustment information DAI may include a plurality of reference values Nref_11, Nref_12, . . . , Nref_1k, Nref_21, Nref_22, . . . , Nref_2m for determining the distribution adjustment degree. For example, when the gap between the numbers of error cells corresponds to a value between the reference value Nref_11 and the reference value Nref_12, the distribution adjustment agree may be determined as −DEG_11. As another example, when the gap between the numbers of error cells corresponds to a value between the reference number −Nref_23 and the reference number −Nref_22, the distribution adjustment degree may be determined as +DET_22.

Referring to FIG. 22B, the distribution adjustment information DAI may include a table including distribution adjustment degrees corresponding to the number of on cells. The distribution adjustment information DAI may include a plurality of reference values Nref_31, N_ref32, ..., Nref_3n, Nref_41, Nref_42, ..., Nref_4p for determining the distribution adjustment degree. The reference value Nref_31 may be equal to the fourth threshold value Nth4 shown in FIG. 20 and the reference value Nref_41 may be equal to the fifth threshold value Nth5 shown in FIG. 20. For example, when the number of on cells corresponds to a value between the reference value Nref_32 and the reference number Nref_33, the distribution adjustment degree may be determined as −DEG_32. As another example, when the number of on cells is less than the reference value Nref_4p, the distribution adjustment degree may be determined as +DET_4p.

Figure 23:
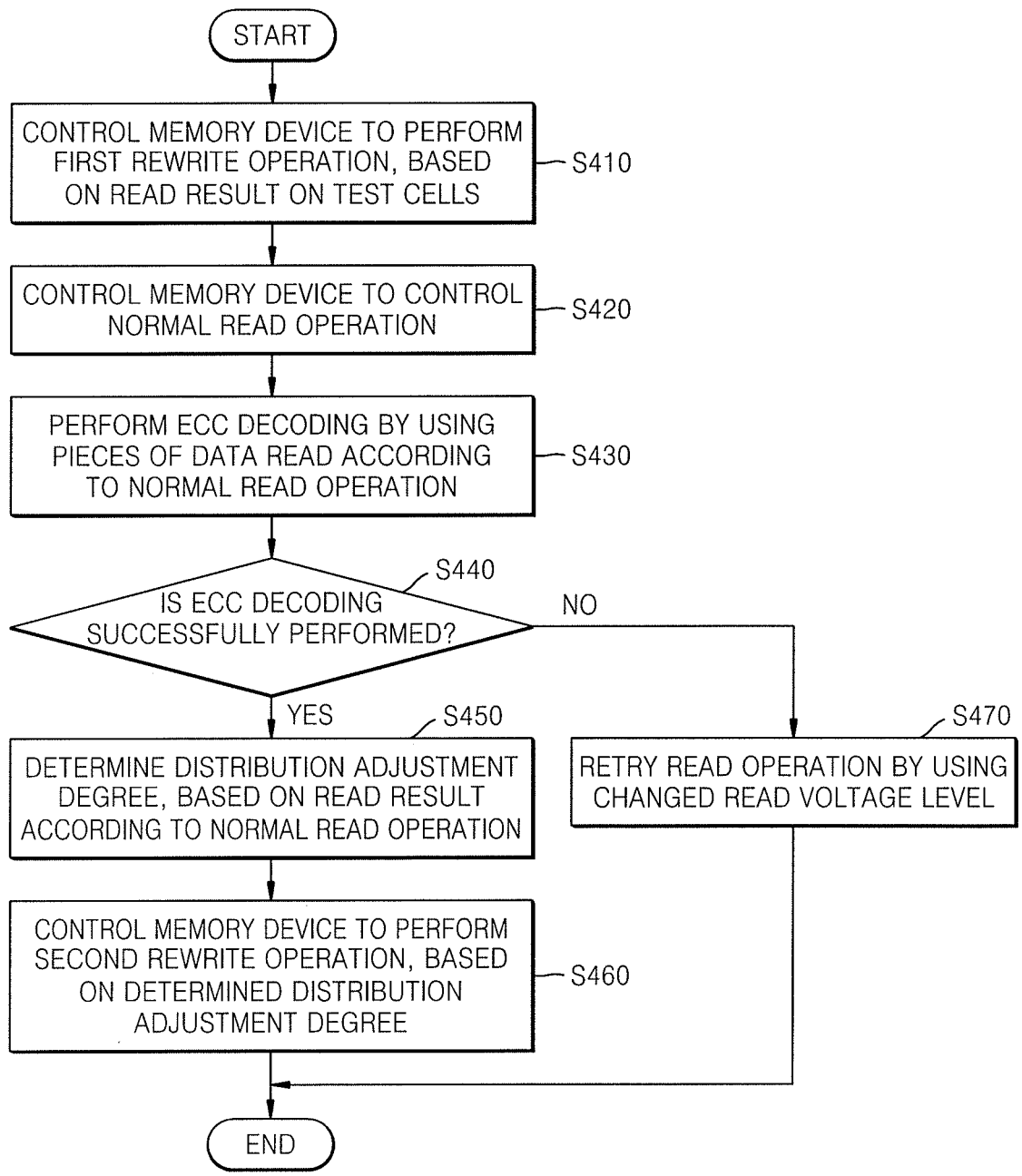
FIG. 23 illustrates a flowchart of a controlling method of the memory controller.

FIG. 23 is a flowchart for describing a controlling method of the memory controller. In FIG. 23, operations added to those of FIG. 7 will be mainly described. For example, operations S410, S420, S450, and S460 may respectively correspond to operations S120, S140, S160, and S180 shown in FIG. 7. The added operations of FIG. 23 are described with reference to FIGS. 1 through 3.

In operation S430, the memory controller 200 may perform an ECC decoding operation using pieces of data read according to the normal read operation. For example, the ECC engine 250 may perform the ECC decoding operation by using the pieces of data read from the normal read operation.

In operation S440, according to whether the ECC decoding is successfully performed, different methods may be determined.

When the ECC decoding is successfully performed, operations S450 and S460 may be performed.

When the ECC decoding operation is not successfully performed, in operation S470, the memory controller 200 may control the memory device 300 by changing the read voltage level such that the memory device 300 retries the read operation.

Only embodiments completed after operation S470 are described with reference to FIG. 23. In an implementation, according to a result of operation S470, when the ECC decoding operation is successfully performed after retrying the read operation, operations S450 and S460 may be performed.

Embodiments provide a method performed by a memory device to rewrite data, a memory controller, a controlling method of the memory controller, whereby read errors due to fluctuation in a distribution of memory cells are reduced and control operations adaptive to characteristics of the memory cells are performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory controller for controlling a memory device, the memory controller comprising:

an error checking and correcting (ECC) engine to perform error detection on data read from the memory device; and a data operation manager to control a first rewrite operation of the memory device on selected memory cells to compensate for a drift in a distribution of the selected memory cells, based on a result of a test read operation of the memory device on test cells, determine a distribution adjustment degree based on a result of a normal read operation, as an ECC decoding operation corresponding to the normal read operation of the memory device is successfully performed by using the ECC engine, and control a second rewrite operation of the memory device based on the determined distribution adjustment degree.

2. The memory controller as claimed in claim 1, wherein the data operation manager is to control the memory device to perform the test read operation when a memory system is powered on after being powered off, the memory system including the memory device and the memory controller.

3. The memory controller as claimed in claim 1, wherein the data operation manager is to control the memory device to perform the first rewrite operation when the number of error cells detected in the test read operation by using a first read level is greater than a first threshold value or when the number of on cells according to the test read operation by using a second read level higher than the first read level is greater than a second threshold value.

4. The memory controller as claimed in claim 1, wherein the data operation manager is to control the memory device to apply, to the selected memory cells, a voltage of a partial rewrite pulse which has a higher level and a shorter duration than a level and duration of a normal read pulse used in the normal read operation.

5. The memory controller as claimed in claim 1, wherein, when the set-state distribution of the selected memory cells before the second rewrite operation is on the right of the set-state normal distribution along a positive resistance axis, the data operation manager is to control the second rewrite operation such that a set-state distribution of the selected memory cells is on the left of a set-state normal distribution.

6. The memory controller as claimed in claim 1, wherein, when the reset-state distribution of the selected memory cells before the second rewrite operation is on the left of the reset-state normal distribution along a positive resistance axis, the data operation manager is configured to control the second rewrite operation such that a reset-state distribution of the selected memory cells is on the right of a reset-state normal distribution.

7. A controlling method of a memory controller, the method comprising:

controlling, based on a result of a test read operation on test cells included in a memory device, a first rewrite operation of the memory device to compensate for a drift of a distribution of selected memory cells;

controlling a normal read operation of the memory device on the selected memory cells, the normal read operation using a normal read pulse; and controlling, based on a distribution adjustment degree determined according to a result of the normal read operation, a second rewrite operation of the memory device on the selected memory cells.

8. The method as claimed in claim 7, wherein controlling the first rewrite operation includes:

transmitting a read command for the test cells to the memory device;
receiving, from the memory device, pieces of test data corresponding to the read command;
determining whether a distribution of the pieces of test data fulfills a first condition indicating degradation of the distribution; and
when the first condition is fulfilled, controlling the memory device to perform the first rewrite operation.

9. The method as claimed in claim 8, wherein determining whether the distribution of the pieces of test data fulfills the first condition includes determining whether the number of error cells detected from the test read operation by using a first read level is greater than a first threshold value.

10. The method as claimed in claim 8, wherein determining whether the distribution of the pieces of test data fulfills the first condition includes determining whether the number of on cells according to the test read operation using a second read level is greater than a second threshold value.

11. The method as claimed in claim 8, wherein controlling the memory device to perform the first rewrite operation includes controlling the memory device to apply a partial rewrite pulse, which has a higher voltage level and a shorter duration than the normal read pulse, to the selected memory cells.

12. The method as claimed in claim 7, wherein the controlling the second rewrite operation includes:
receiving pieces of read data according to the normal read operation;
determining whether a distribution of the pieces of read data fulfills a second condition indicating degradation of the distribution; and
determining the distribution adjustment degree as the second condition is fulfilled, based on information regarding the distribution of the pieces of read data.

13. The method as claimed in claim 12, wherein determining whether the distribution of the pieces of read data fulfills the second condition includes determining whether the number of error cells detected in the normal read operation is greater than a third threshold value.

14. The method as claimed in claim 13, wherein determining the distribution adjustment degree includes:
obtaining, based on an ECC result provided from the ECC engine, a number of first error cells converted from an original set-state to a reset-state and a number of second error cells converted from an original reset-state to a set-state;
comparing the number of first error cells to the number of second error cells;
when the number of first error cells is greater than the number of second error cells, determining the distribution adjustment degree such that set-state cells from among the selected memory cells have a resistance distribution having a level that is lower than a set-state normal distribution; and
when the number of first error cells is not greater than the number of second error cells, determining the distribution adjustment degree such that reset-state cells from among the selected memory cells have a resistance distribution having a level higher than a reset-state normal distribution.

15. The method as claimed in claim 14, wherein, when the number of first error cells is greater than the number of second error cells, controlling the second rewrite operation further includes controlling the memory device to apply, to the set-state cells from among the selected memory cells, a pulse corresponding to an adaptive set pulse having at least one of a lower current level and a longer duration than that of the normal set pulse.

16. The method as claimed in claim 14, wherein, when the number of first error cells is not greater than the number of second error cells, controlling of the second rewrite operation further includes controlling the memory device to apply, to reset-state cells from among the selected memory cells, a current corresponding to an adaptive reset pulse having at least one of a higher current level and a shorter duration than that of the normal reset pulse.

17. The method as claimed in claim 12, wherein determining whether the distribution of the pieces of read data fulfills the second condition comprises determining whether a number of on cells corresponding to the normal read operation is greater than a predetermined fourth threshold value or less than a predetermined fifth threshold value, the fifth threshold value being less than the predetermined fourth threshold value.

18. The method as claimed in claim 17, wherein determining the distribution adjustment degree includes:
obtaining the number of on cells based on a cell count result provided from a cell counter;
when the number of on cells is greater than the fourth threshold value, determining the distribution adjustment degree such that set-state cells from among the selected memory cells have a resistance distribution lower than a set-state normal distribution; and
when the number of on cells is less than the fifth threshold value, determining the distribution adjustment degree such that reset-state cells from among the selected memory cells have a resistance distribution higher than a reset-state normal distribution.

19. A method of rewriting data of a memory device, the method comprising:
performing, on selected memory cells, a normal data write operation including a normal reset operation to form a reset-state normal distribution using a normal reset pulse and a normal set operation to form a set-state normal distribution using a normal set pulse;
when a drift in a distribution of the selected memory cells is detected according to a test read operation on test cells, performing a partial rewrite operation on the selected memory cells to compensate for the drift;
performing a normal read operation on the selected memory cells using a normal read pulse;
determining a direction of degradation in the distribution of the selected memory cells from the normal read operation; and
performing, based on the reset-state normal distribution and the set-state normal distribution, an adaptive rewrite operation to form distributions shifted in a direction opposite the determined direction of the degradation.

20. The method as claimed in claim 19, wherein performing of the adaptive rewrite operation includes:
when the number of first error cells converted from an original set state to a reset state is greater than the number of second error cells converted from an original reset state to a set state, applying, to set-state cells from among the selected memory cells, a current corresponding to an adaptive set pulse having at least one of a lower current level and a longer duration than the normal set pulse;
when the number of first error cells is not greater than the number of second error cells, applying, to reset-state cells from among the selected memory cells, a current corresponding to an adaptive reset pulse having at least one of a higher current level and a shorter duration than the normal reset pulse.

* * * * *